(12) United States Patent
Kashiwakura

(10) Patent No.: US 9,397,418 B2
(45) Date of Patent: *Jul. 19, 2016

(54) TRANSMISSION SYSTEM AND METHOD FOR CONSTRUCTING BACKPLANE SYSTEM

(75) Inventor: Kazuhiro Kashiwakura, Tokyo (JP)

(73) Assignee: NEC CORPORATION, Tokyo (JP)

(*) Notice: Subject to any disclaimer, the term of this patent is extended or adjusted under 35 U.S.C. 154(b) by 353 days.

This patent is subject to a terminal disclaimer.

(21) Appl. No.: 14/008,422

(22) PCT Filed: Mar. 30, 2012

(86) PCT No.: PCT/JP2012/058602
§ 371 (c)(1),
(2), (4) Date: Sep. 27, 2013

(87) PCT Pub. No.: WO2012/133781
PCT Pub. Date: Oct. 4, 2012

(65) Prior Publication Data
US 2014/0011402 A1    Jan. 9, 2014

(30) Foreign Application Priority Data
Mar. 30, 2011    (JP) .................. 2011-073984

(51) Int. Cl.
*H05K 1/11* (2006.01)
*H01R 12/50* (2011.01)
*H01R 13/66* (2006.01)
(Continued)

(52) U.S. Cl.
CPC ............ *H01R 12/50* (2013.01); *G06F 13/4086* (2013.01); *H01R 13/6625* (2013.01); *H01R 13/6658* (2013.01); *H01R 23/7073* (2013.01); *H04L 25/0298* (2013.01); *H05K 1/0243* (2013.01); *H05K 7/1439* (2013.01);
(Continued)

(58) Field of Classification Search
CPC ........... H01R 13/6616; H01R 13/6625; H01R 13/6658; H01R 23/7073; H05K 1/141; H05K 1/14; H05K 7/1439
USPC ......... 361/784, 785, 786, 787, 788, 791, 803; 439/620.1, 620.11, 620.12, 620.13, 439/620.15, 620.16, 825, 826
See application file for complete search history.

(56) References Cited

U.S. PATENT DOCUMENTS

| 7,448,880 B2 | 11/2008 | Osaka |
| 2007/0130555 A1 | 6/2007 | Osaka |
| 2010/0124848 A1* | 5/2010 | Atkinson ............. H01R 13/719 439/620.09 |

FOREIGN PATENT DOCUMENTS

| JP | 2002-530001 | 9/2002 |
| JP | 2006-526883 | 11/2006 |

(Continued)

OTHER PUBLICATIONS

International Search Report, PCT/JP2012/058602, Jul. 3, 2012.

*Primary Examiner* — Hoa C Nguyen
*Assistant Examiner* — Binh Tran
(74) *Attorney, Agent, or Firm* — Young & Thompson

(57) ABSTRACT

The present invention provides a system and a method which enable an increase in signal transmission speed and stable operation, without incurring the likes of restrictions on the manufacturing of circuit boards. A transmission system includes an AC terminal connector, having an AC termination circuit including a resistor and a capacitor, at the open ends of through hole stubs provided in a circuit board.

14 Claims, 21 Drawing Sheets

PROTOTYPE

BACKPLANE SYSTEM

(51) Int. Cl.
*H04L 25/02* (2006.01)
*H05K 1/02* (2006.01)
*H05K 7/14* (2006.01)
*G06F 13/40* (2006.01)
*H05K 1/14* (2006.01)
*H05K 11/00* (2006.01)

(52) U.S. Cl.
CPC ......... *H05K 1/141* (2013.01); *H05K 2201/044* (2013.01); *H05K 2201/10295* (2013.01)

(56) References Cited

FOREIGN PATENT DOCUMENTS

| | | |
|---|---|---|
| JP | 2007-142307 | 6/2007 |
| JP | 2007-317716 | 12/2007 |
| JP | 2009-188272 | 8/2009 |
| JP | 2010-537402 | 12/2010 |

* cited by examiner

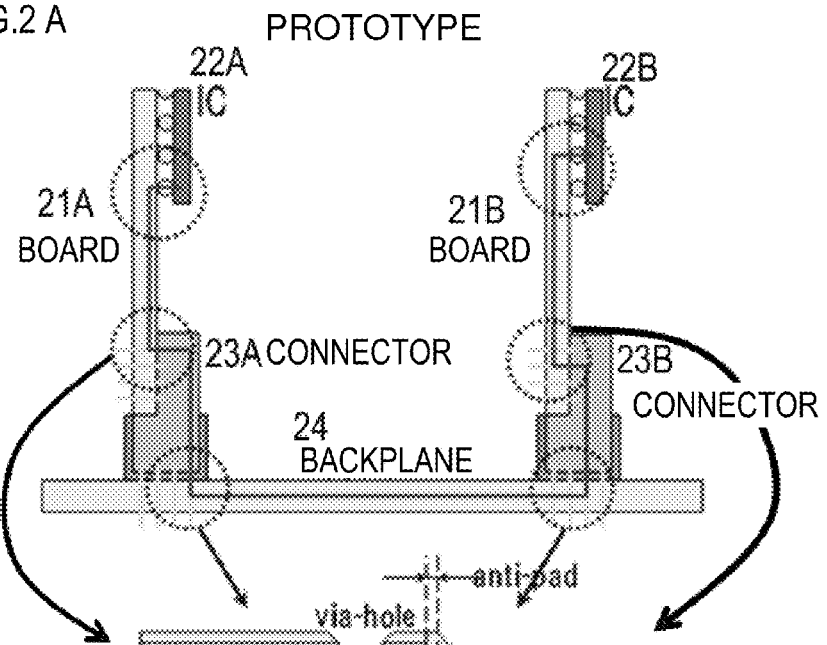
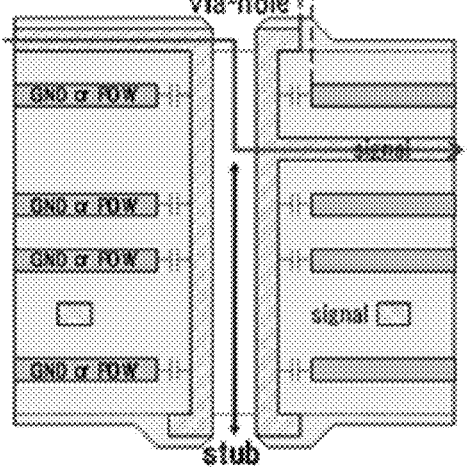
FIG.2 A PROTOTYPE
FIG.2 B PROTOTYPE

FIG.5    PROTOTYPE

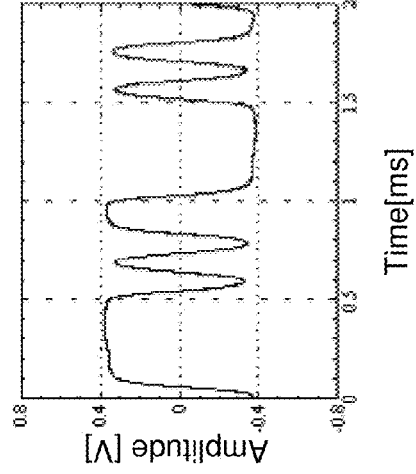
FIG.15 A SEND WAVEFORM
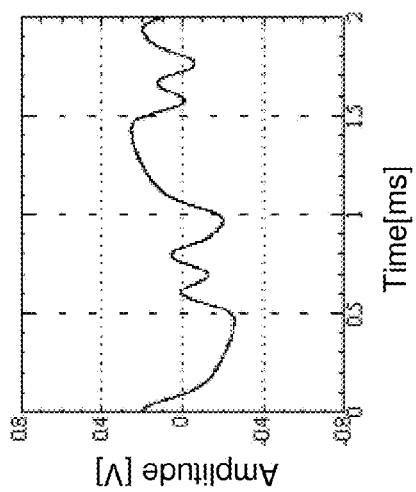
FIG.15 B RECEIVE WAVEFORM
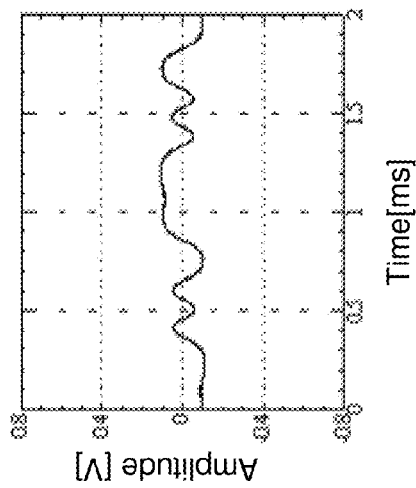
FIG.15 C EQUALIZER PASSING WAVEFORM

TRANSMISSION SYSTEM AND METHOD FOR CONSTRUCTING BACKPLANE SYSTEM

CROSS-REFERENCE TO RELATED APPLICATION

The present application asserts priority rights derived from JP Patent Application 2011-073984 filed in Japan on Mar. 30, 2011. The total contents of disclosure of the patent application of the senior filing date are to be incorporated by reference into the present application.

TECHNICAL FIELD

This invention relates to a signal transmission technique. More particularly, it relates to a method for constructing a backplane system, and to a transmission system.

BACKGROUND

Recently, with spread use of IT (Information Technology) equipments, an amount of information traffic in an information processing apparatus is increasing enormously. Hence, a signal bandwidth in the information processing apparatus is also increasing. A through-hole stub does not exert no effect on a transmission characteristic as long as a signal propagation is propagated at a rate of the order of 1 to 6 Gbps (Gigabits per second). However, when a transmission rate surpasses 10 Gbps, deterioration in the transmission characteristic begins to be markedly noticeable.

Among the related techniques to overcome the deterioration in a characteristic caused by a through-hole stub, there is a technique of through-hole processing by back-drill that cuts a through-hole and a near-by board portion using a drill. The through-hole portion is cut by a drill having a diameter slightly larger than an external shape of the through-hole to bore a hole to remove a through-hole portion corresponding to a stub. However, only few board manufacturers are able to use a back-drill at their disposal. Moreover, the back-drill is of a problem in connection with cost and supply. There is thus a demand for a technique which should take the place of back-drilling. The following describes a typical example of a backplane system as a transmission system.

FIG. 1 is a diagram illustrating an example (prototype) of a backplane system used in a communication equipment, as an example. A backplane is a sort of a printed circuit board, and includes, on its lateral side, a plurality of connectors, also termed backplane connectors. A plurality of cards, mounted on the connectors, are interconnected to form a bus system. Note that a midplane includes a plurality of connectors (backplane connectors) on both sides of its circuit board. Although in the following description, a backplane structure is described as an example, it is possible to replace the backplane structure with a midplane structure.

Referring to FIG. 1, line cards 11 and a switch card 12 are mounted on connectors of a backplane 14 (backplane connectors 13). The backplane takes charge of electrical connection between the switch card 12 and one of the line cards 11 to perform signal transmission of a line signal via the switch card 12 to the other line card 11. Recently, a line speed transitions from 1 Gbps to 10 Gbps, and is going to evolve further to 40 Gbps or even to 100 Gbps. It is thus necessary to speed up backplane transmission with deterioration of a signal characteristic being suppressed, as shown in FIG. 1.

FIGS. 2A and 2B illustrate a configuration (physical specifications) of the backplane system shown in FIG. 1. FIG. 2A is a diagram schematically illustrating a lateral cross-sectional view of the backplane, connectors and the cards (boards). FIG. 2B is a diagram schematically illustrating sectional view of areas encirclued by dotted-line circles of the board and the backplane of FIG. 2A, and illustrates a through-hole and a stub.

Referring to FIG. 2A, a line signal is coupled on a path including an IC (Integrated Circuit) 22A-> a board 21A (a small-sized printed circuit board mounted on the backplane, also termed a 'daughter card' or 'a daughter board')-> a connector 23A-> a backplane 24-> a connector 23B, -> a board (daughter card) 21B-> an IC 22B. The connector 23A (23B) includes a terminal (connector terminal) inserted (press-fit) into a through-hole of a board (daughter card) 21A (21B) and another terminal (connector terminal) inserted (press-fit) into a through-hole of the board of the backplane 24.

FIG.2B schematically illustrates a cross-section of a multilayer board. A signal wiring (interconnect) is coupled to a signal layer (signal) at a preset depth (the depth corresponding to a depth of the signal layer from the board surface) from a through-hole surface coated with an electrically conductive member such as plating to establish electrical conduction. That is, an electrical signal fed to the signal layer (signal), is supplied from an upper part of the through-hole to enter into the signal layer (signal) near at a midpoint of the through-hole, as shown in FIG.2B. Since the through-hole extends to underneath the portion at which the signal layer (signal) is connected to the through-hole, the portion at which the signal layer (signal) is connected to the through-hole (a bending potion of the signal wiring in FIG.2B) becomes a branch point of signal path. Hence, the signal propagated from the upper part of the through-hole is propagated at the branch point (bending portion) into the signal layer (signal) in the multilayer board. However, part of the signal propagated from the upper part of the through-hole proceeds from the branch point further downward through the through-hole. The part of the through-hole underneath the branch point, though in itself not being a signal path, is electrically conductive and hence becomes a signal propagation path. In the case where a signal path is branched at a branch point in this manner, the part which is not in itself a signal path is generally termed a "stub" (stub: branch wiring). The signal proceeding from the branch point downward through the through-hole is reflected back at a bottom end portion of the through-hole and proceeds upwards through the through-hole to return to the branch point. There are times when the signal proceeding downwards from the branch point collides against the signal reflected back from the bottom end portion of the through-hole to affect adversely a transmission characteristic of the signal. The effect is outstanding in a high frequency signal, a high speed digital signal and the like. In FIG.2B, on a lower-side ground plane (power supply) area surrounding differential via (via-hole), there is formed an opening (clearance) freed of the ground plane (power supply), and is termed an anti-pad.

FIG. 3 is a diagram illustrating an example of a connection configuration between a connector (backplane connector 33) and a board (daughter card) and between the connector (backplane connector 33) and a backplane. As the backplane connector 33, a press-fit connector in which its connector terminals 35 are press-fit into corresponding through-holes 34 formed in the board 3, may be used but not limited thereto.

FIG. 4 is a diagram illustrating a signal propagation through a connection portion between the connector (backplane connector) of FIG. 3 and a board (a daughter card or a backplane). A board 41 of the daughter card or the backplane is a multilayer board including a power supply layer or a GND layer (ground layer or ground plane) 42, a signal layer 44 and a dielectric material 43 between the respective layers. The signal layer 44 is provided between GND layers 42, for example. Referring to FIG. 4, a signal from a connector terminal 45 (corresponding to the connector terminal 35 of the backplane connector 33 of FIG. 3) at a top end portion of a through-hole 46, is propagated into the signal layer 44 at a branch point of the signal layer. However, part of the signal flows, within the terminal 45, from the branch point to a downward portion of the through-hole 46 to be reflected back at the bottom end of the through-hole 46. The so reflected signal part collides, at the branch point to the signal layer 44, against the signal proceeding via the upper part of the connector terminal 45. That is, the reflected wave encounters further reflection at the branch point within the through-hole where there occurs multi-reflection. The end part of the connector terminal 45 in the through-hole 46 is open and hence the signal undergoes total reflection. The branch point in the through-hole 46 (point of connection to the signal layer 44) is at a low impedance, and hence the signal is reflected with phase inversion. As a consequence, there results a quarter-wavelength resonance by a standing wave having the end part of the connector terminal as an anti-node and the branch point in the through-hole as a node.

With a stub length L (in FIG. 4, a length between the coupling part of the signal layer 44 to the through-hole 46 and the lower end of the through-hole), the wavelength γ of the standing wave is given by the following equation (1):

$$\lambda = 4L/n \ (n=1, 3, 5, \ldots) \quad (1)$$

The product of the resonance frequency f and the wavelength γ is the velocity of light, such that $$f \times \lambda = C \quad (2)$$
$$= CO/\sqrt{(\varepsilon r)}$$

(C being the velocity of light through a substance having a specific inductive capacity εr)

where CO is the velocity of light in vacuum, and is given by $$CO = 1/\sqrt{(\varepsilon O \times \mu O)} \quad (3)$$

where εO and μO stand for the specific inductive capacity and the magnetic permeability of vacuum, respectively.

Hence, the resonance frequency f is given by the following equation (4):

$$f = n \times CO/(4 \times L \times \sqrt{\varepsilon r}) \quad (4)$$

In equation (4), n is a positive odd number (1, 3, 5, . . . ), CO is the velocity of light in vacuum, L is the stub length and εr is the specific inductive capacity.

FIG. 5 is a diagram explaining the above mentioned signal transmission path (differential transmission path). In FIG. 5, backplane connectors 54A and 54B correspond to the connectors 23A, and 23B of FIG. 2A, respectively. In FIG. 5, a connector terminal 53A corresponds to a connector terminal of the connector 23A connected to the through-hole of the daughter card 21A of FIG. 2A. and a connector terminal 55A corresponds to a connector terminal of the connector 23A connected to the through-hole of the backplane 24 of FIG. 2A. In FIG. 5, a connector terminal 55B corresponds to a connector terminal of the connector 23B connected to the through-hole of the backplane 24 of FIG. 2A. A connector terminal 53B corresponds to a connector terminal of the connector 23B connected to the through-hole of the daughter card 21B of FIG. 2A.

A signal differentially output from an output buffer 51 (an output buffer, not shown, in the IC 22A of FIG. 2A) is delivered to the connector terminals 53A of the backplane connector 54A via wirings 52A in a daughter card (corresponding to the board 21A of FIG. 2A, for example), the connector terminals 55A of the backplane connector 54A, wirings 56 in the backplane (corresponding to the signal layer 44 of FIG. 4, for example), the connector terminals 55B of the backplane connector 54B, the connector terminals 53B of the backplane connector 54B and via wirings 52B in a daughter card (corresponding to the board 21B of FIG. 2A, for example) differentially to an input buffer 57 (an input buffer, not shown, provided in the IC 22B of FIG. 2A). The input buffer 57 includes a termination resistor between differential inputs. The differential input signal is supplied to an equalizer circuit and equalized.

A signal received from a connector via a wiring is deteriorated in a manner as detailed with reference to FIG. 4, under the effect of a reflected wave generated at an open end of a stub parasitically produced within a through-hole provided in a backplane. There occurs energy distribution into an energy passing from the branch point in the through-hole into the through-hole and an energy passing through a board (a signal layer in a daughter card or in a backplane). The energy passing through the through-hole is reflected at an end of the through-hole (open stub end). There occurs at the branch point in the through-hole further reflection of the reflected wave, and here multi-reflection occurs. Hence, a quarter-wavelength resonance occurs by a standing wave having an end of the connector terminal as an anti-node and the branch point in the through-hole as a node.

An insertion loss in a differential through-hole of FIG. 7 shows the results of an analysis of a through-hole structure (differential through-hole) of FIG. 6, in order to demonstrate above mentioned phenomena. In FIG. 7, the abscissa is a frequency and the ordinate is an input differential insertion loss Sdd21 (unit in dB). In the example of FIG. 7, the input differential insertion loss Sdd21 is of about −24 dB, in the vicinity of 7 GHz (maximum absolute value of the insertion loss (attenuation)), due to the quarter-wavelength resonance in the through-hole stub.

In FIG. 6, a backplane connector terminal pair 67, differentially transmitting a signal, is connected to a signal through-hole pair 62. The signal through-hole pair 62 is connected, in the signal layer disposed between GND layers 64, to a signal wiring pair 65. In FIG. 6, a stub (through-hole stub) 66 is a section between an open end at a bottom end of the signal through-hole 62 and a connection portion of the signal through-hole 62 and the signal wiring 65.

With a speed up of a line interface, a transmission rate not less than 10 Gbps is required on the backplane. Due to the through-hole characteristic described above, it may be understood that transmission is difficult.

Several literatures to solve this problem are known. However, they have respectively certain drawbacks.

Patent Literature 1 discloses a circuit board in which at least part of a through-hole and a via is drilled to reduce length of an electrically conductive stub of the hole, wherein the drilled part of the hole includes a transitioning portion from a first profile to a second profile to reduce reflection from the drilled hole end portion. The technique disclosed cuts the stub of the through-hole by drilling to reduce resonance caused by the stub. The technique is good in characteristic. However the drilling is difficult to control during board fabrication and there is concern about high costs due to the problem of yield or the like. Moreover, quality-related problems caused by residual burrs in cutting process by drilling have not yet been solved.

To address a problem that in high speed transmission of a signal on a differential wiring, waveform distortion occurs due to impedance mismatch, in a via-hole with an open stub, thus producing the jitter, Patent Literature 2 discloses a configuration in which the degree of coupling of the differential wiring is reduced, with a differential characteristic impedance remaining constant. That is, there is disclosed a technique in which the degree of coupling of the differential wiring is optimized to reduce an adverse effect caused by the through-hole stub. The technique presupposes that deterioration by a stub occurs at a frequency range sufficiently higher than an operating range and that the signal in the frequency range lower than the operating range is to be stabilized. In short, the technique disclosed is not able to compensate for the deterioration characteristic proper to the stub. There is not disclosed such a technique that overcomes limitations in the case where the signal frequency range is approximately the same as the frequency range of deterioration produced by the stub.

Patent Literature 3 discloses a method which optimizes a via structure to improve a high frequency performance of a backplane, and a method which optimizes a size as well as a shape of the via structure to improve its high frequency integrity performance. In FIG. 2 of the Patent Literature 3, an electrically conductive portion of a via composing a stub section is removed by drilling to remove a non-used stub portion of a plated through-hole (PTH). This leads to a problem of complicated designing. Moreover, problems of cost as well as quality due to back-drilling are not solved.

Patent Literature 4 discloses a configuration in which an integrated circuit includes an enclosed termination resistor designed to match to a characteristic impedance of a transmission line (signal source impedance), and in which the signal source drives a plurality of IC devices on a printed circuit board. The IC devices are cascade-connected in a chain, and internal resistors of the IC devices except the last IC device in the chain are bypassed by a short circuit underneath the IC devices, with the internal resistor of the last IC device in the chain not having a short circuit underneath it. Although a technique of providing the termination resistor within the IC device to increase the bus speed is disclosed, the technique does not solve the problem of deterioration in the through-hole characteristic brought about by a stub.

CITATION LIST

Patent Literature

Patent Literature 1:
Japanese Patent Kohyo Publication No. JP2010-537402A
Patent Literature 2:
Japanese Patent Kokai Publication No. JP2007-142307A
Patent Literature 3:
Japanese Patent Kohyo Publication No. JP2006-526883A
Patent Literature 4:
Japanese Patent Kohyo Publication No. JP2002-530001A

SUMMARY

The following analysis is given by the present invention.
In the related techniques, there is not shown a technique which is capable of performing backplane transmission at a rate of, for example, 10 Gbps or higher, without undergoing a manufacturing constraint or the like of a circuit board.

It is an object of the present invention to provide a system and a method capable of speeding up signal transmission and assuring a stable operation, without undergoing a manufacturing constraint or the like of a circuit board.

According to the present invention, there is provided a transmission system comprising an AC termination connector including an AC termination circuit including a resistor and a capacitor, wherein the AC termination connector is connected to an open end of a stub of a through-hole provided in a circuit board.

According to the present invention, there is also provided a method for constructing a backplane system comprising connecting an AC connector to an open end of a stub of a through-hole provided in a backplane. The AC connector includes an AC termination circuit including a resistor and a capacitor.

According to the present invention, backplane or midplane transmission may be effected at a high speed and in stability without undergoing a manufacturing constraint or the like of a circuit board. Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG.2A is a side view of a backplane system, and FIG.2B is a schematic cross-sectional view for illustrating a board through-hole.

FIGS.15A, 15B and 15C are waveform diagrams for illustrating signal propagation on the characteristic of FIG.13.

FIG. 19A is a top plan view, FIG. 19B is a front view and FIG. 19C is a side view.

PREFERRED MODES

Figure 1:
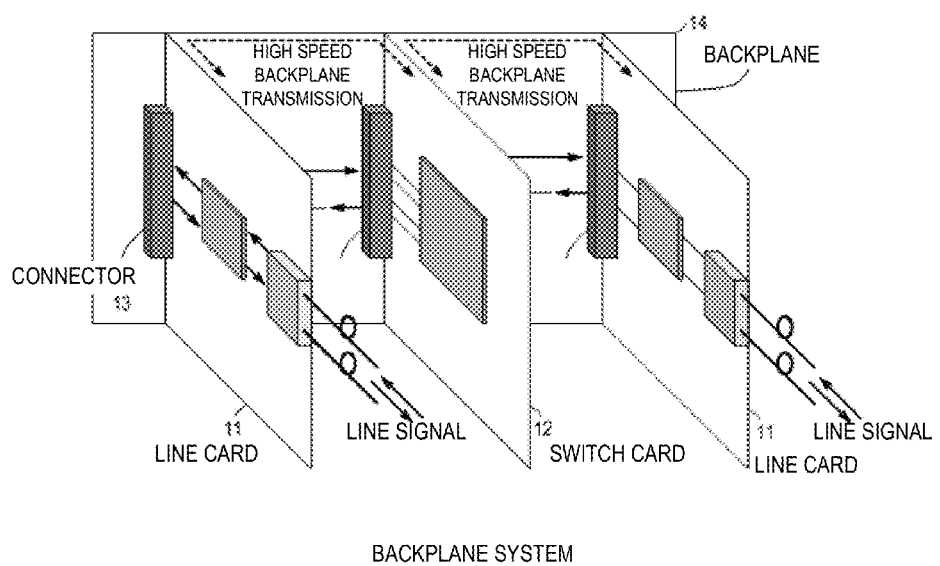
FIG.1 is a schematic view illustrating an example (prototype) of a backplane system.
Figure 3:
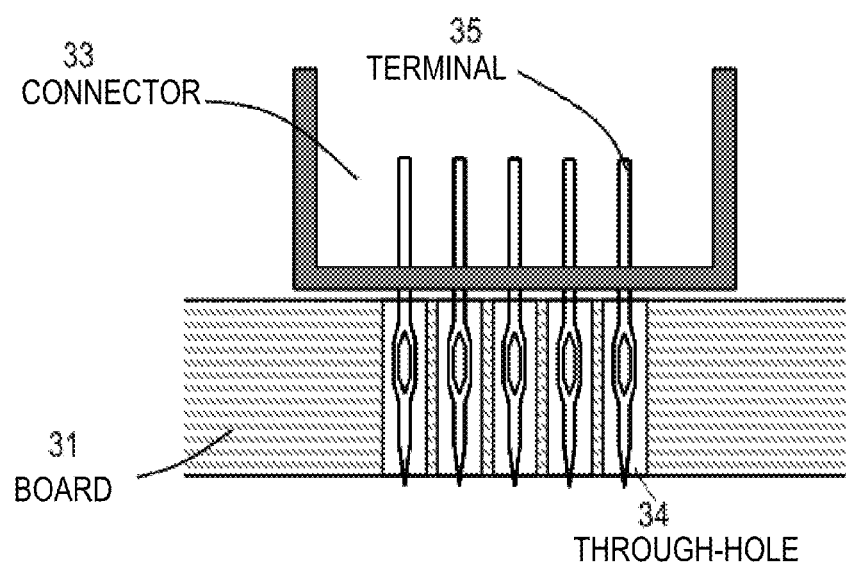
FIG.3 is a schematic cross-sectional view illustrating a connector/daughter card connection configuration and a connector/backplane connection configuration.

According to the present invention, there is provided a technique which implements enables a signal transmission in a backplane or a midplane, used in a communication equipment, such as a router, a switch or a switching unit, or in an information processing equipment, such as a server or a storage to be speed up and operated in stability.

In several preferred modes, an AC termination connector (a through-hole stub AC termination connector) including an AC termination circuit including a resistor and a capacitor is connected to an open end of a stub of a through-hole provided in a circuit board.

In several preferred modes, the through-hole includes a pair of through-holes that differentially transmits a signal. First and second connector terminals (97 of FIG. 9) are inserted from one surface side of the circuit board (91 of FIG. 9) into the pair of through-holes (92). The AC termination connector (100 of FIG. 9) includes third and fourth connector terminals (termination terminals 106 of FIG. 9) that are inserted, opposing respectively to the first and second connector terminals, into the pair of through-holes (92 of FIG. 9) in a surface opposite to the one surface of the circuit board. A series circuit (AC termination circuit) of a resistor (102) and a capacitor (103) is connected between the third and fourth terminal connectors (106 of FIG. 9).

In several preferred modes, the through-hole includes a pair of through-holes that differentially transmits a signal. First and second connector terminals are inserted from one surface side of the circuit board into the pair through-holes. The AC termination connector may include third and fourth connector terminals inserted, opposing respectively to the first and second connector terminals, into the pair through-holes in a surface opposite to the one surface of the circuit board. The AC termination connector may also include a first AC termination circuit composed by a series circuit including a first resistor and a first capacitor and being connected between the third connector terminal and the ground, and a second AC termination circuit composed by a series circuit including a second resistor and a second capacitor and being connected between the fourth connector terminal and the ground.

In several preferred modes, the circuit board is either a backplane or a midplane.

In several preferred modes, the circuit board is a backplane, and the first and second connector terminals are connector terminals (97) of a backplane connector connected to the pair of through-holes of the backplane.

In several preferred modes, an AC termination connector including an AC termination circuit (89A or 89B of FIG. 8) including a resistor and a capacitor, may be connected to an open end of a stub of a through-hole provided in a daughter card mounted on the backplane with a backplane connector. The daughter card includes first and second through-holes differentially transmitting a signal. First and second connector terminals of the backplane connector are inserted respectively into the first and second through-holes from one surface side of the daughter card. The AC termination connector includes third and fourth connector terminals inserted, opposing respectively to the first and second connector terminals, into the first and second through-holes in a surface opposite to the one surface of the daughter card, and the AC termination circuit (89A or 89B of FIG. 8) composed by a series circuit including a resistor and a capacitor and being connected to the third and fourth connector terminals. Or, the AC termination connector may include third and fourth connector terminals inserted, opposing respectively to the first and second connector terminals, into the first and second through-holes in a surface opposite to the one surface of the circuit board. The AC termination connector may also include a first AC termination circuit (89A or 89B of FIG. 17) composed by a series circuit including a first resistor and a first capacitor and being connected between the third connector terminal and the ground. The AC termination connector may also include a second AC termination circuit (89C or 89D of FIG. 17) composed by a series circuit including a second resistor and a second capacitor and being connected between the fourth connector terminal and the ground.

Or, in a preferred mode, a transmission system may include:

a first semiconductor chip (22A of FIG. 2A) including an output buffer (81 of FIG. 8) differentially outputting a signal;

a first daughter card (21A of FIG. 2A) having the first semiconductor chip mounted thereon and connected thereto;

a first backplane connector (23A of FIG. 2, 84A of FIG. 8) that secures the first daughter card on the backplane;

a second semiconductor chip (22B of FIG. 2A) including an input buffer (87 of FIG. 8) differentially receiving a signal;

a second daughter card (21B of FIG. 2A) having the second semiconductor chip mounted thereon and connected thereto;

a second backplane connector (23B of FIG. 2, 84B of FIG. 8) that secures the second daughter card on the backplane; and a backplane (24 of FIG. 2A) including the circuit board.

The AC termination connector may include a first AC termination connector and a second AC termination connector including first and second AC termination circuits (89A, 89B of FIG. 8), respectively.

Each of the first and second AC termination circuits is a series circuit including a resistor and a capacitor.

First and second connector terminals (85A) of the first backplane connector (84A) are inserted from one surface side of the backplane into first and second through-holes differentially transmitting a signal. First and second connector terminals (85B) of the second backplane connector (84B) are inserted from one surface side of the backplane into third and fourth through-holes differentially transmitting a signal.

The first AC termination connector includes third and fourth connector terminals (termination terminals 106 of FIG. 9) inserted, opposing respectively to the first and second connector terminals of the first backplane connector, into the first and second through-holes in a surface opposite to the one surface of the backplane, respectively; and a first AC termination circuit (88A of FIG. 8) composed by a series circuit including a first resistor (102) and a first capacitor (103) and being connected between the third and fourth connector terminals.

The second AC termination connector includes third and fourth connector terminals (termination terminals 106 of FIG. 9) inserted, opposing respectively to the first and second connector terminals of the second backplane connector, into the third and fourth through-holes in a surface opposite to the one surface of the backplane, respectively; and a second AC termination circuit (89B) composed by a series circuit including a second resistor and a third capacitor and being connected between the third and fourth connector terminals.

Or, in preferred modes, the AC termination connector may include first to fourth AC termination connectors respectively including first to fourth AC termination circuits (88A, 88C, 88B, 88D of FIG. 17) each composed by a series circuit including a resistor and a capacitor. First and second connector terminals (85A) of the first backplane connector (84A) are inserted, from one surface side of the backplane, into first and second through-holes differentially transmitting a signal. First and second connector terminals (85B) of the second backplane connector (84B) are inserted, from one surface side of the backplane, into third and fourth through-holes differentially transmitting a signal.

The first AC termination connector includes a third connector terminal (106 of FIG. 9) inserted, opposing to the first connector terminal (85A of FIG. 17) of the first backplane connector, into the first through-hole (92 of FIG. 9) in a surface opposite to the one surface of the backplane; and a first AC termination circuit (88A of FIG. 17) composed by a series circuit including a first resistor and a first capacitor and being connected between the third connector terminal and the ground.

The second AC termination connector includes a fourth connector terminal inserted, opposing to the second connector terminal (85A of FIG. 17) of the first backplane connector, into the second through-hole (92 of FIG. 9) in a surface opposite to the one surface of the backplane; and a second AC termination circuit (88C of FIG. 17) composed by a series circuit including a second resistor and a second capacitor and being connected between the fourth connector terminal and the ground.

The third AC termination connector includes a fifth connector terminal inserted, opposing to the first connector terminal (85B) of the second backplane connector (84B of FIG. 17), into the third through-hole in a surface opposite to the one surface of the backplane; and a third AC termination circuit (88B of FIG. 17) composed by a series circuit including a third resistor and a third capacitor and being connected between the fifth connector terminal and the ground.

The fourth AC termination connector may include a sixth connector terminal inserted, opposing to the second connector terminal (84B of FIG. 17) of the second backplane connector, into the fourth through-hole in a surface opposite to the one surface of the backplane; and a fourth AC termination circuit (88D of FIG. 17) composed by a series circuit including a fourth resistor and a fourth capacitor and being connected between the sixth connector terminal and the ground. The following describes exemplary embodiments.

<First Exemplary Embodiment>

Figure 5:
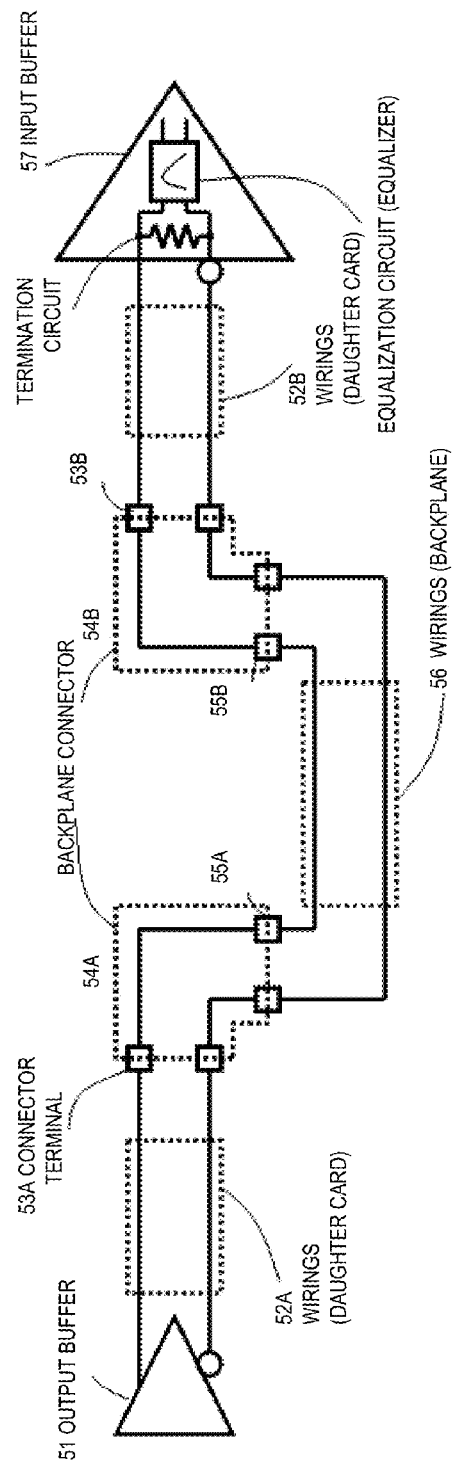
FIG.5 is a circuit diagram illustrating a configuration of a differential transmission system.
Figure 8:
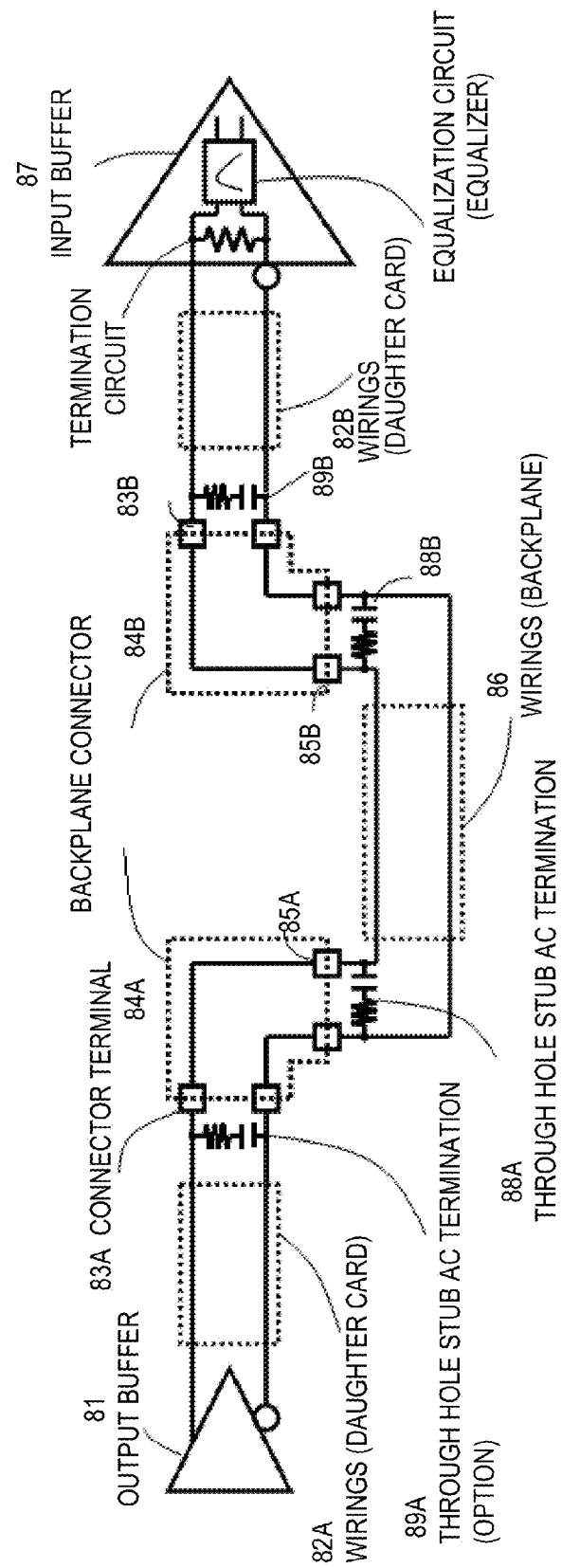
FIG.8 is a circuit diagram illustrating a configuration of a first exemplary embodiment of the present invention.

FIG. 8 shows a first exemplary embodiment of the present invention. Contrasting FIG. 5 with FIG. 8, in the present exemplary embodiment, through-hole stub AC termination circuits (88A, 88B) are provided in differential signal through-holes to which backplane connectors are connected. In high speed backplane transmission, a differential transmission circuit is used. Differential outputs from an output buffer 81 are coupled to connector terminals 83A of a backplane connector 84A by wirings 82A in a daughter card. Differential inputs at an input buffer 87 and connector terminal 83B of a backplane connector 84B are coupled together by wirings 82B in another daughter card. Connector terminals 85A and 85B of the backplane connectors 84A and 84B are interconnected by backplane wirings 86. In general, the characteristic impedance of the differential wirings is of about 100 ohms. The connector terminals 83A (83B) of the backplane connectors 84A (84B) are interconnected by press fit in the through-holes of the daughter cards. The connector terminals 85A (85B) of the backplane connectors 84A (84B) are connected by press fit in backplane through-holes.

Figure 4:
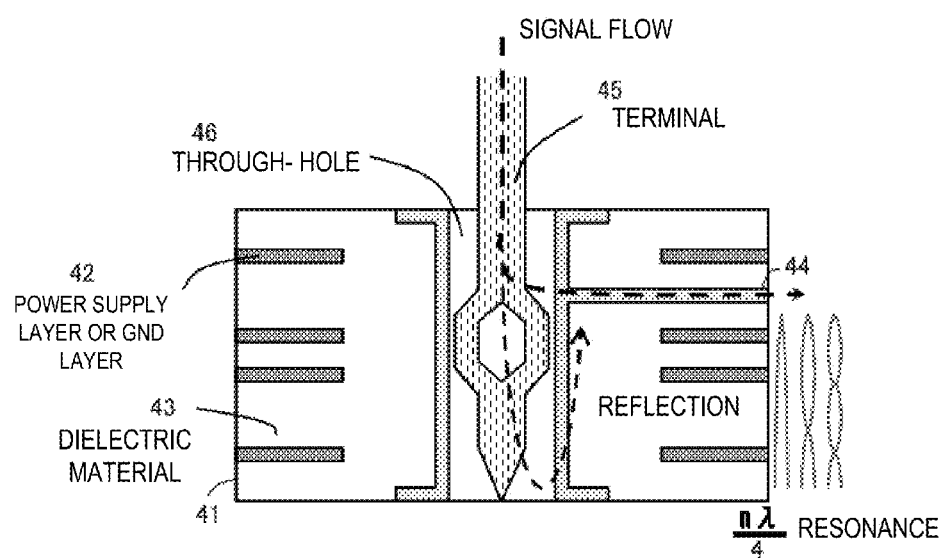
FIG.4 is a schematic cross-sectional view illustrating a state of signal propagation in a connector and a board.

As described with reference to FIG. 4, a stub exists parasitically within each backplane through-hole. In the stub portion, a through-hole stub AC termination circuit 88, composed by a resistor R and a capacitor C, is connected between differential signals.

Figure 6:
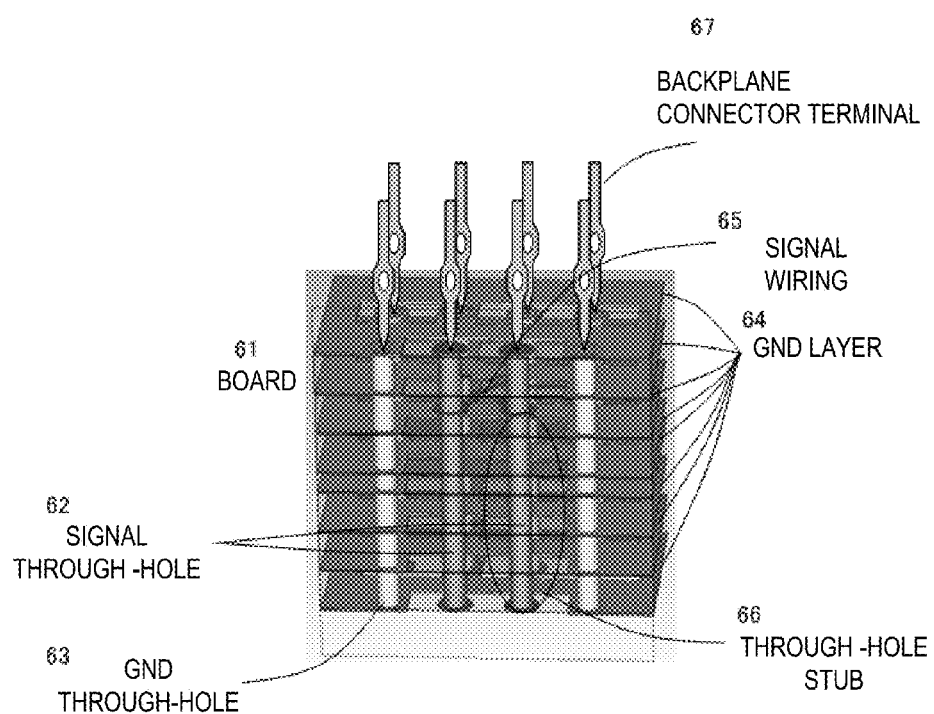
FIG.6 is a schematic view for illustrating a connection between backplane connector terminals and through-holes.
Figure 9:
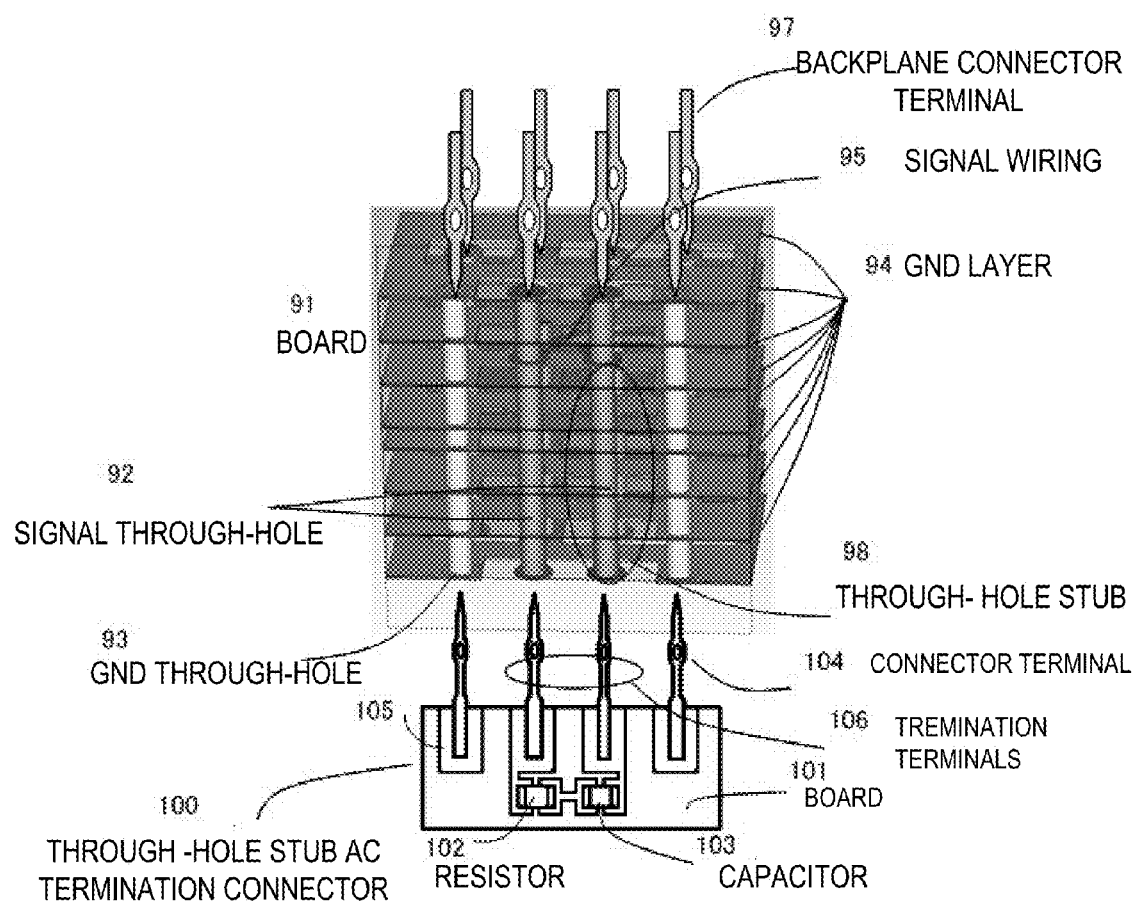
FIG.9 is a cross-sectional view illustrating an example implementation of a first exemplary embodiment of the present invention.

FIG. 9 is a view illustrating an image of an implementation of a through-hole stub AC termination connector 100. The configuration of FIG. 9 is obtained by connecting the through-hole stub AC termination connector 100 to an open end of a stub in the configuration of FIG. 6. Specifically, the through-hole stub AC termination connector 100 is mounted on a surface of the board opposite to a press-fitting (indentation) portion, described above, as shown in FIG. 9.

In the through-hole stub AC termination connector 100, interconnect pads 105 of a pair of connector terminals 106, out of a plurality of connector terminals, press fit into a pair of through-holes formed on a board (backplane board or daughter card board), are connected by a series circuit including a resistor 102 and a capacitor 103. The pair of connector terminals (termed also 'termination terminals') 106 are press-fit into pair signal through-holes 92, differentially transmitting a signal, for operation as termination terminals. The series circuit including the resistor 102 and the capacitor 103 composes an AC termination circuit. The through-hole stub AC termination connector 100 also includes a pair of connector terminals 104 on both sides of the pair of termination terminals 106 terminating the differential signals. The pair of connector terminals 104, constituting the other pair of connector terminals, are press-fit into GND through-holes 93 disposed on both sides of the pair signal through-holes 92 of the board 91. In the board 91, a pair of signal wirings 95 on a signal layer are connected to a pair of signal through-holes to allow for differential signal propagation. A signal layer is provided between a neighboring GND layer 94 with interposition of an insulation layer (dielectric material).

Whether or not the through-hole stub AC termination connector is to be provided on a daughter card is optional. The through-hole stub AC termination connector is to be mounted in case the resonance frequency calculated in accordance with the equation (4) is within a signal operating range. In the daughter card, the board (see boards 21A, 21B of FIG. 2A) is usually of a reduced thickness, and hence the through-hole is shallow in depth. Therefore, in many cases, the resonance caused by stub does not exert an influence.

Figure 18:
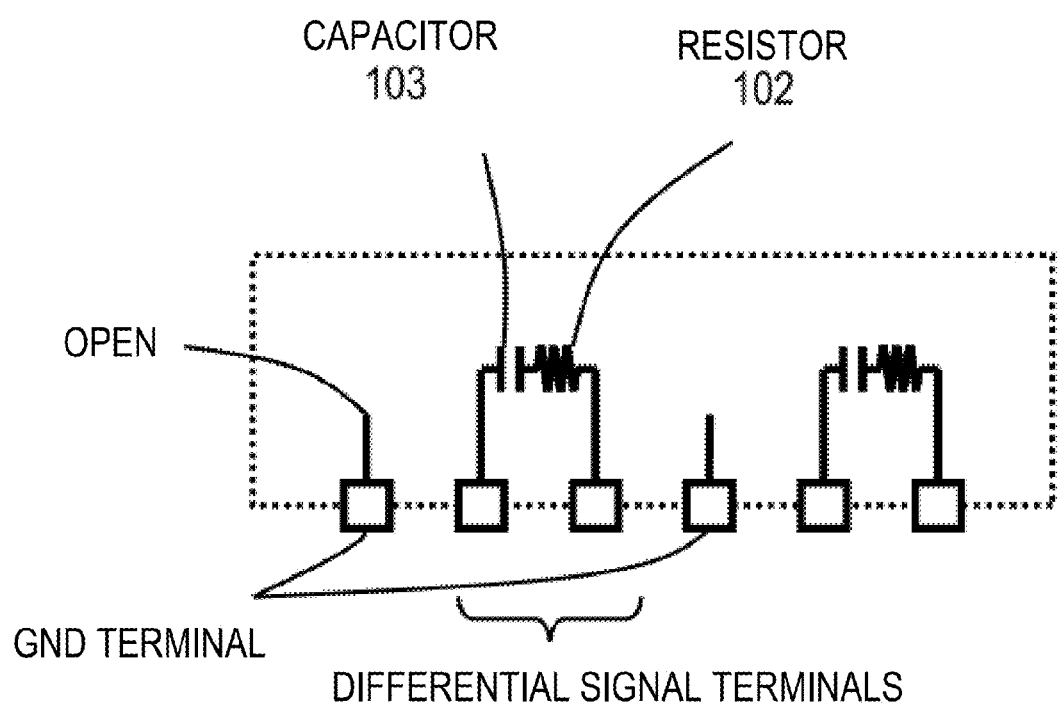
FIG. 18 is a schematic view illustrating a circuit configuration of a through-hole stub AC termination connector of the first exemplary embodiment of the present invention.

In the present exemplary embodiment, a through-hole stub AC termination connector of a circuit shown in FIG. 18 may also be used. The through-hole stub AC termination connector includes a plurality of pairs of differential signal terminals and GND terminals on left and right sides of each pair of differential signal terminals. A series circuit including a resistor and a capacitor is provided across differential signal terminals of each pair. The differential signal terminal pair is inserted into the corresponding signal through-holes 92 of FIG. 9, as an example. The GND terminals on left and right sides of the differential signal terminal pair are inserted into corresponding GND through-holes 93 of FIG. 9.

Figure 19:
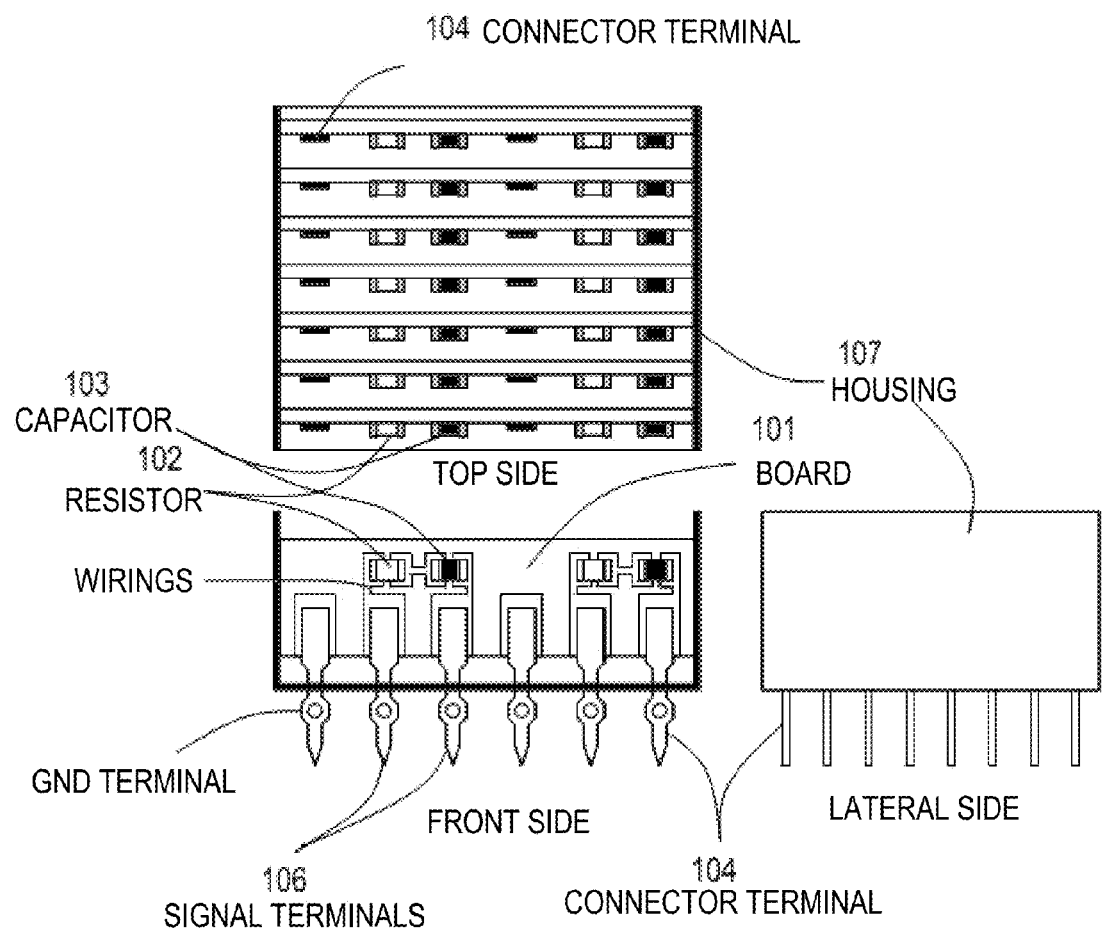
FIGS. 19A, 19B and 19C schematically show the configuration of a through-hole stub AC termination connector of the first exemplary embodiment of the present invention, where

FIGS. 19A to 19C illustrate an example structure configuration of the through-hole stub AC termination connector. Specifically, FIG. 19A is a top plan view of the connector and FIG. 19B illustrates front view. FIG. 19C is a side view of the connector looking from a lateral side of a housing 107. The example of FIG. 19 uses a board to mount an AC termination circuit formed by the resistor and the capacitor. However, it is unnecessary to use a board in case strength or reliability is not problematical even if the board is not used. That is, it is only sufficient that a resistor and a capacitor are connectable across the pair differential signal terminals 106.

An example of FIG. 19 illustrates an image of a connector comprising seven rows with each row accommodating two pairs of differential signals (see the top plan view of FIG. 19A and the side view of FIG. 19C). The number of the pairs or the number of the rows in the connector terminals is arbitrary. In FIG. 19B, the connector is shown inverted from FIG. 9. In FIG. 19B, the signal terminal pair 106 out of connector terminals 104 are identical with the termination terminal pair 106 of FIG. 9.

Figure 20:
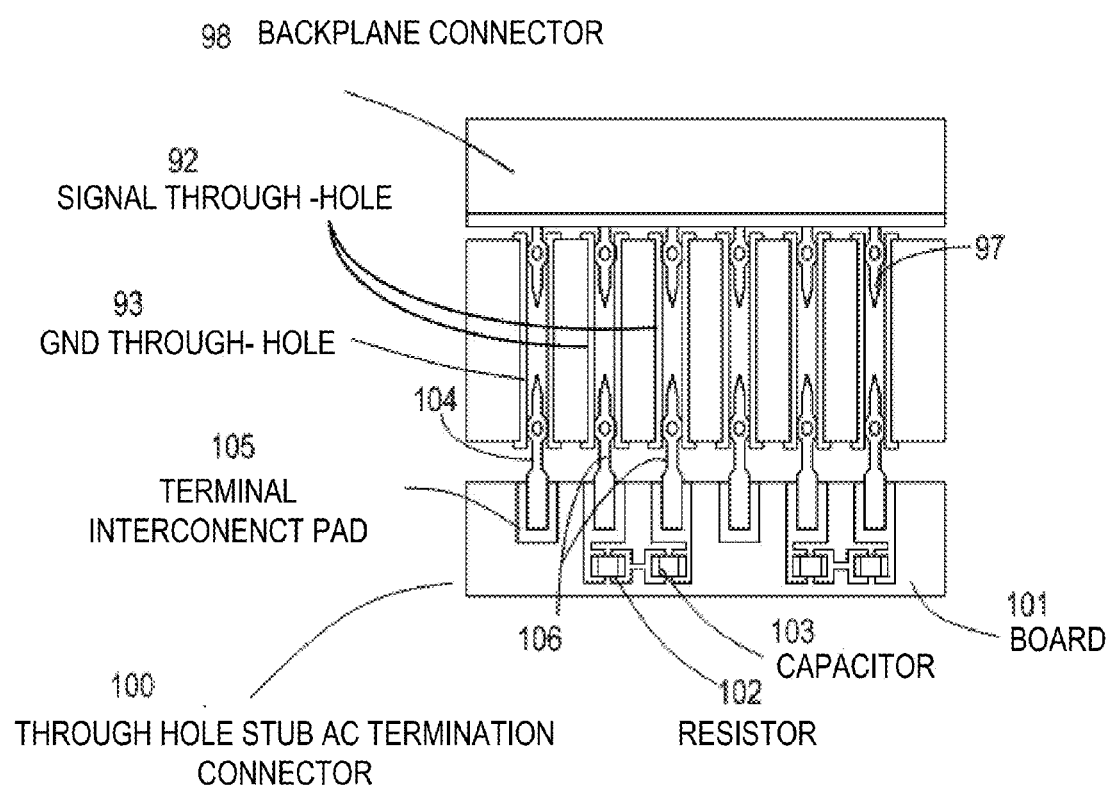
FIG. 20 is a schematic cross-sectional view illustrating the state of actual implementation of the through-hole stub AC termination connector of FIG. 19.

FIG. 20 illustrates an mount image of the through-hole stub terminal connector of FIG. 19. A through-hole stub AC termination connector 100 is mounted on a back surface of a backplane connector that connects a backplane to a daughter card.

Since no GND terminal is used in the through-hole stub AC termination connector 100 of this specification, GND terminals in the through-hole stub AC termination connector 100 may be dispensed with.

Figure 7:
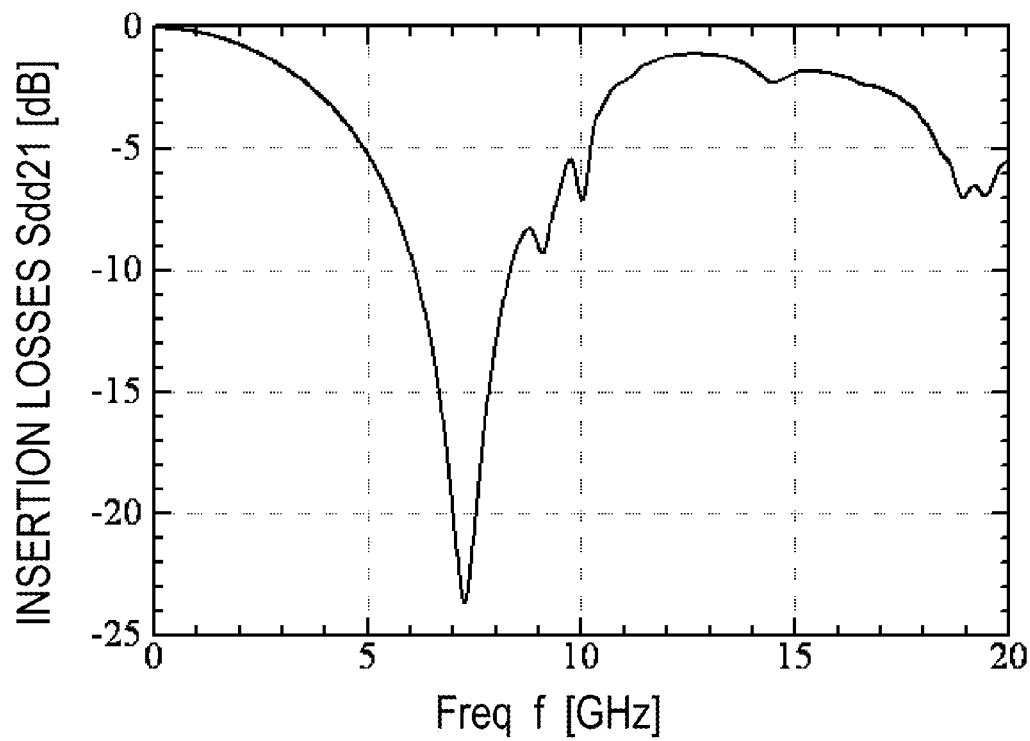
FIG.7 is a graph showing a characteristic of differential through-hole insertion losses.

Referring again to FIG. 8, the operation of the transmission system of the present exemplary embodiment will now be described. In backplane transmission, a differential transmission circuit shown in FIG. 8 is used, and a signal is propagated along a path of the output buffer 81-> backplane connector 84A-> backplane connector 84B-> the input buffer 87. In high speed transmission, equivalent to or exceeding 10 Gbps, a transmission waveform is attenuated due to attenuation characteristic of a transmission line including wirings, connectors, and through-holes. Moreover, a parasitic stub exist in the connecting portion of the backplane connector, thus deteriorating the characteristic, as shown in FIG. 7. It is because resonance occurs between a branch point within the through-hole and its open end, as described above with reference to FIG. 4.

Figure 10:
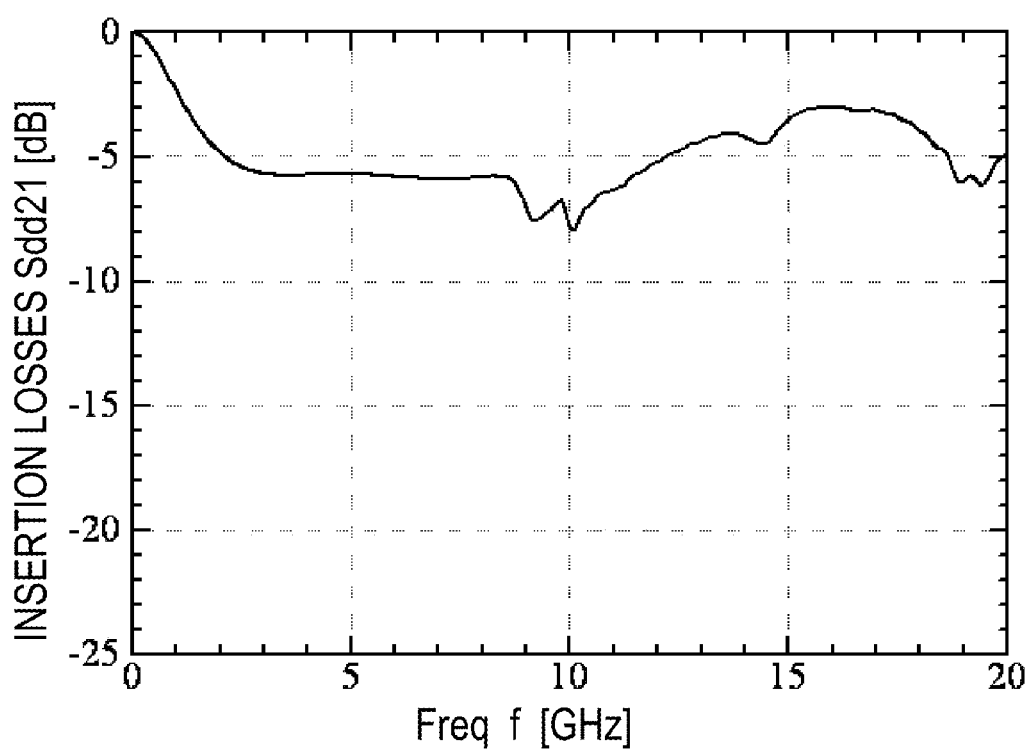
FIG.10 is a graph showing a characteristic of differential through-hole insertion losses in the first exemplary embodiment.

By providing through-hole stub AC termination at an open end of a stub, as shown in FIG. 9, it is possible to eliminate reflection to prevent deterioration otherwise caused by the resonance. FIG. 10 shows a characteristic of the through-hole stub AC termination. Originally, the attenuation as much as −24 dB occurred in the vicinity of 7 GHz (see FIG. 7). By providing the through-hole stub AC termination connector 100 at the open end of a through-hole stub 98, it is possible to suppress the attenuation to an extent of −6 dB.

The characteristic impedance (differential impedance) of a differential transmission line is generally designed to be of about 100 ohms. Hence, the resistance value of about 100 ohms at the through-hole stub AC termination would be appropriate. Since it is common that the characteristic impedance of the through-hole becomes smaller than 100 ohms, the resistance value at the through-hole stub AC termination may be correspondingly smaller. On the other hand, a capacitance value of the capacitor at the termination of the through-hole stub AC termination of about several pF is acceptable. The capacitance value is effective to suppress a loss of a DC component by the termination resistor.

Figure 11:
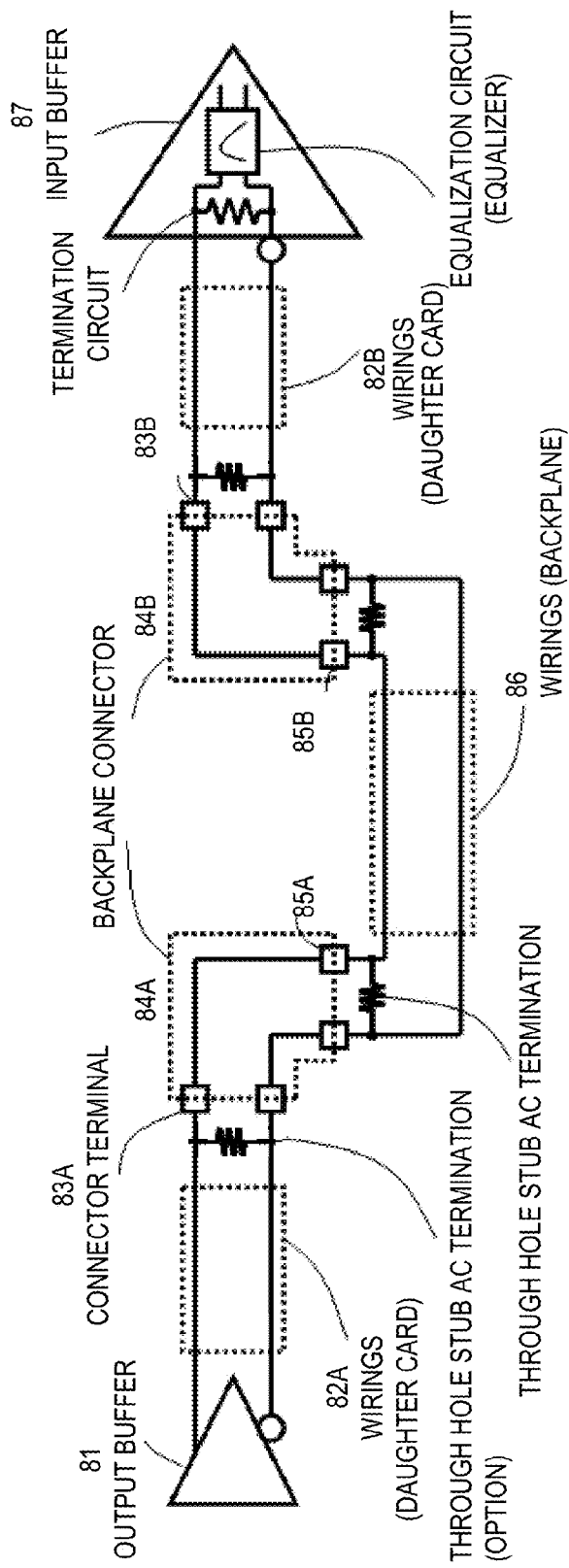
FIG.11 is a circuit diagram illustrating the configuration of a reference Example.
Figure 12:
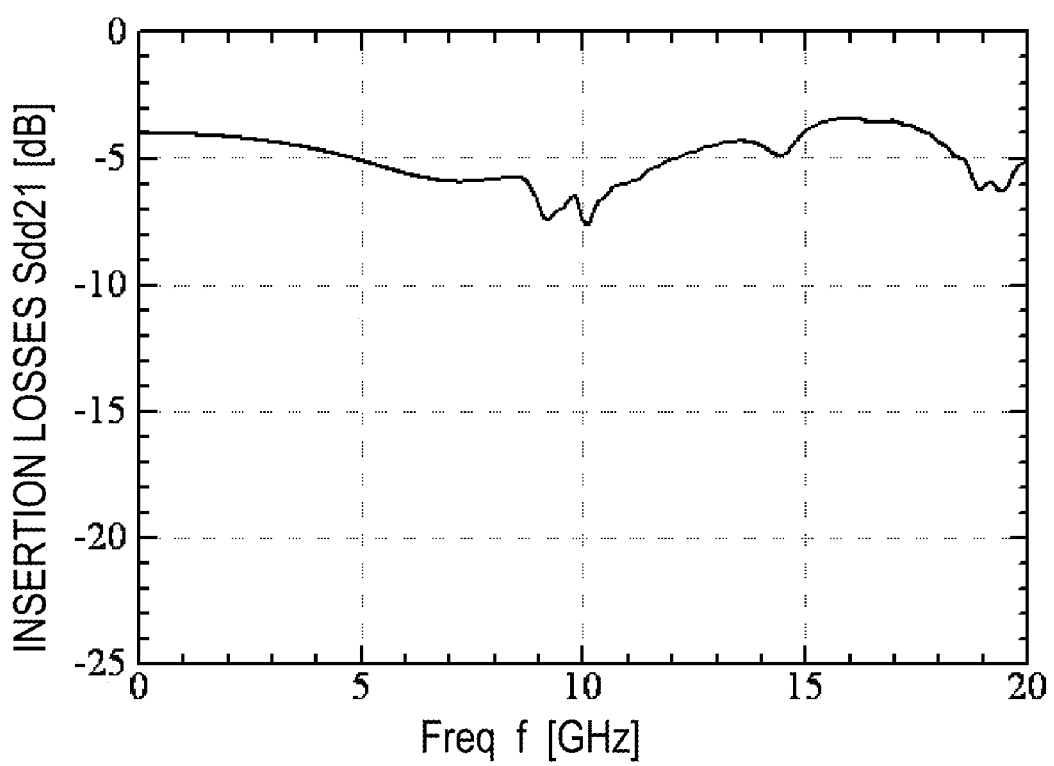
FIG.12 is a graph showing a characteristic of differential through-hole insertion losses in the reference Example.

FIG. 11 illustrates a configuration in which a through-hole stub AC termination is provided by just a resistance, that is, to the exclusion of a capacitor, by way of reference or comparative example. FIG. 12 shows a characteristic of a through-hole in the reference example of FIG. 11. It goes without saying that attenuation occurs in the low frequency range as well, in an amount corresponding to the lack of the capacitor at the through-hole stub termination, thus possibly causing troubles in transmission in the low frequency range.

Figure 13:
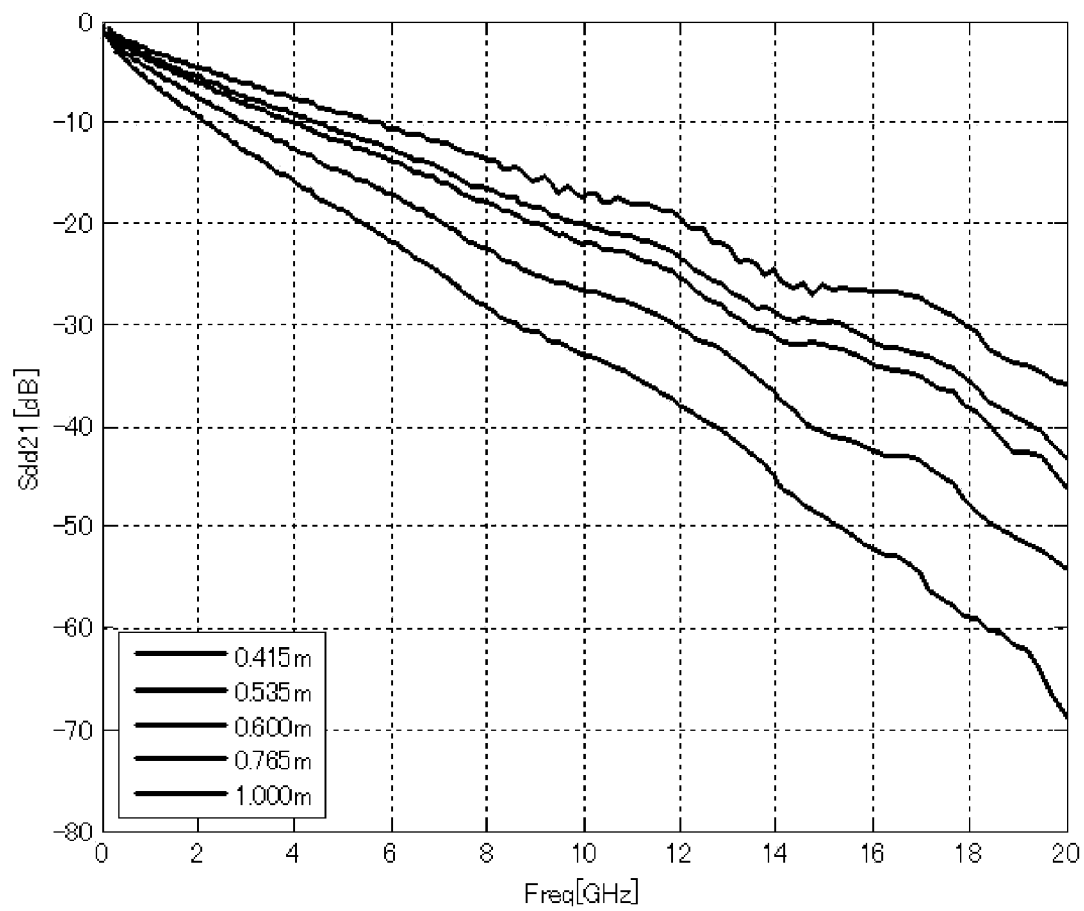
FIG.13 is a graph showing a characteristic of a transmission line.
Figure 14:
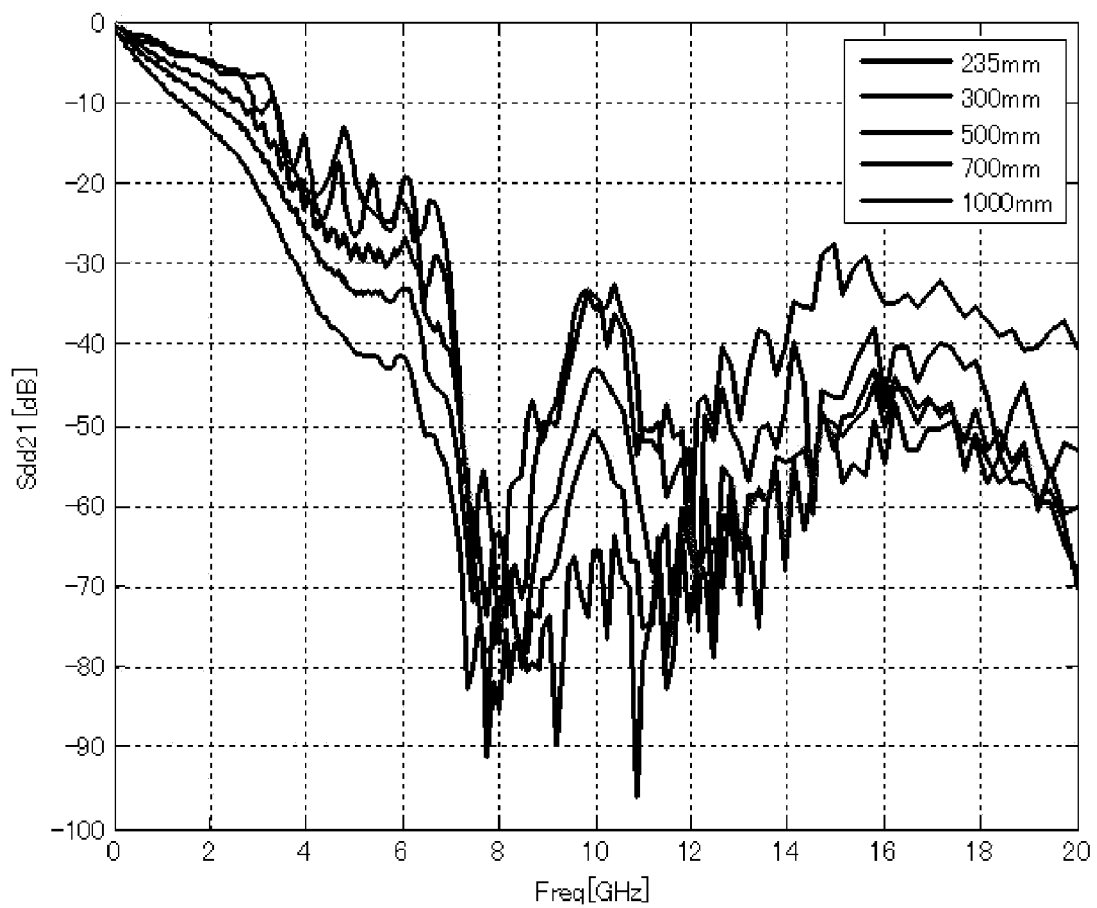
FIG.14 is again a graph showing a characteristic of a transmission line.

In general, the characteristic of the transmission line including wirings, connectors and the through-holes is represented by a curve indicating increasingly larger attenuation towards a higher frequency, as indicated in FIGS. 13 and 14.

In the absence of resonance at the through-hole stub, characteristic curves for stub lengths equal to 0.415, 0.535, 0.600, 0.765 and 1.000 m will exhibit evenly decreasing profiles towards right, as indicated in FIG. 13. In this figure, the ordinate denotes differential insertion loss Sdd21, and the abscissa the frequency in GHz. In the presence of a stub resonance, the characteristic becomes irregular, as shown in FIG. 14.

On a transmission line, exhibiting a characteristic which evenly descends rightwards, as shown in FIG. 13, signal propagation occurs in such a manner that the greater the pulse width, the smaller becomes the attenuation, whereas, the smaller the pulse width, the greater becomes the attenuation.

Figure 16:
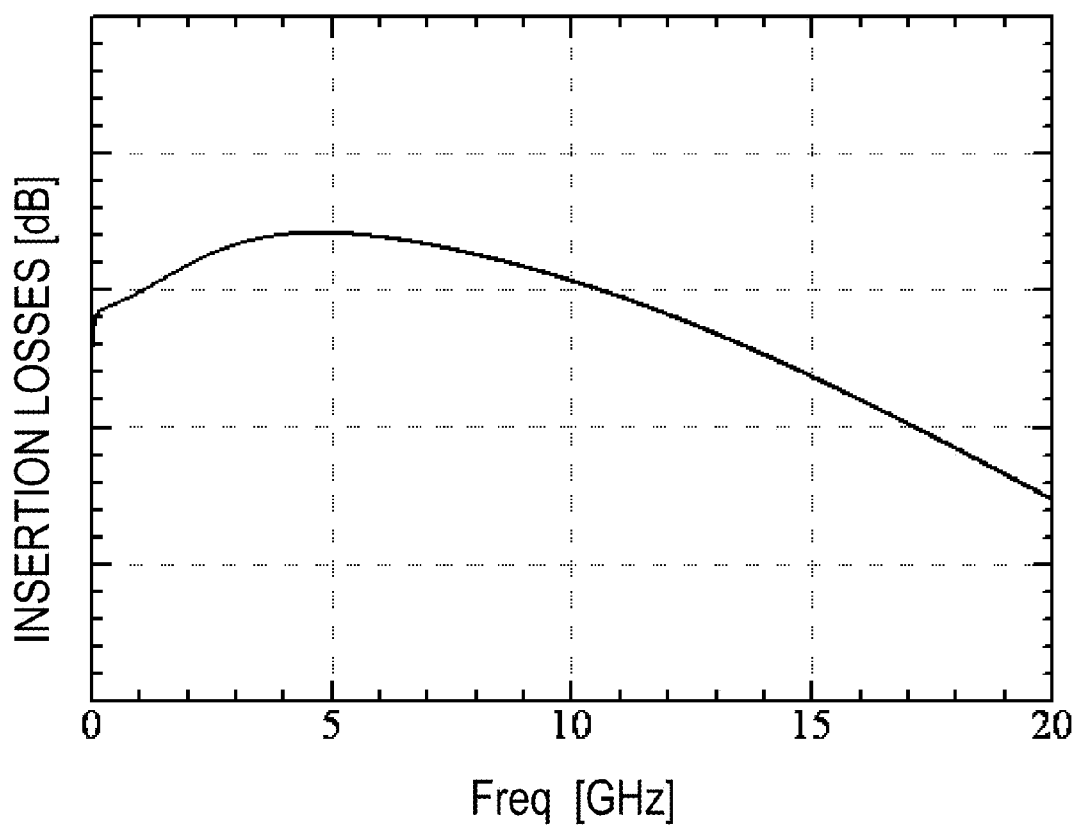
FIG. 16 is a graph showing a characteristic (insertion losses) of an equalizer circuit.

FIG. 16 shows an example characteristic of an equalizer circuit of the input buffer 87. Referring to FIG. 16, the example characteristic is such a one that exhibits an upwardly convex characteristic (loss characteristic) having the Nyquist frequency of signal propagation as a peak (a peak in the vicinity of 5 GHz), and that boosts the highest frequency component while gradually attenuating frequency components lower than the Nyquist frequency. Such characteristic may be exploited in such a manner that a signal having a greater pulse width is intentionally decreased in amplitude and a signal having a smaller pulse width is amplified to get balance between low frequency components and high frequency components to achieve signal waveform shaping that will allow for discrimination between 0 and 1 logical levels.

However, when a characteristic is irregular (such as one shown for example in FIG. 14), there is produced a non-uniform waveform propagation wherein a signal having a large pulse width becomes smaller and a signal having a small pulse width becomes larger. Such signal is unable to have its waveform shaped by an equalizer circuit that has a characteristic shown in FIG. 16.

With the use of AC termination, composed by a resistor and a capacitor, at an open end of a through-hole stub, as described above, it is possible to prevent resonance otherwise produced at the through-hole stub to implement stabilized backplane transmission. Moreover, by using a through-hole stub AC termination connector, without mounting a resistor and a capacitor constituting a termination circuit on a backplane, with the through-hole stub AC termination connector connected to the backplane by press fit, a soldering process, such as reflow, may be reduced. Thus, there is a merit of being able to suppress manufacturing costs of the backplane.

<Second Exemplary Embodiment>

Figure 17:
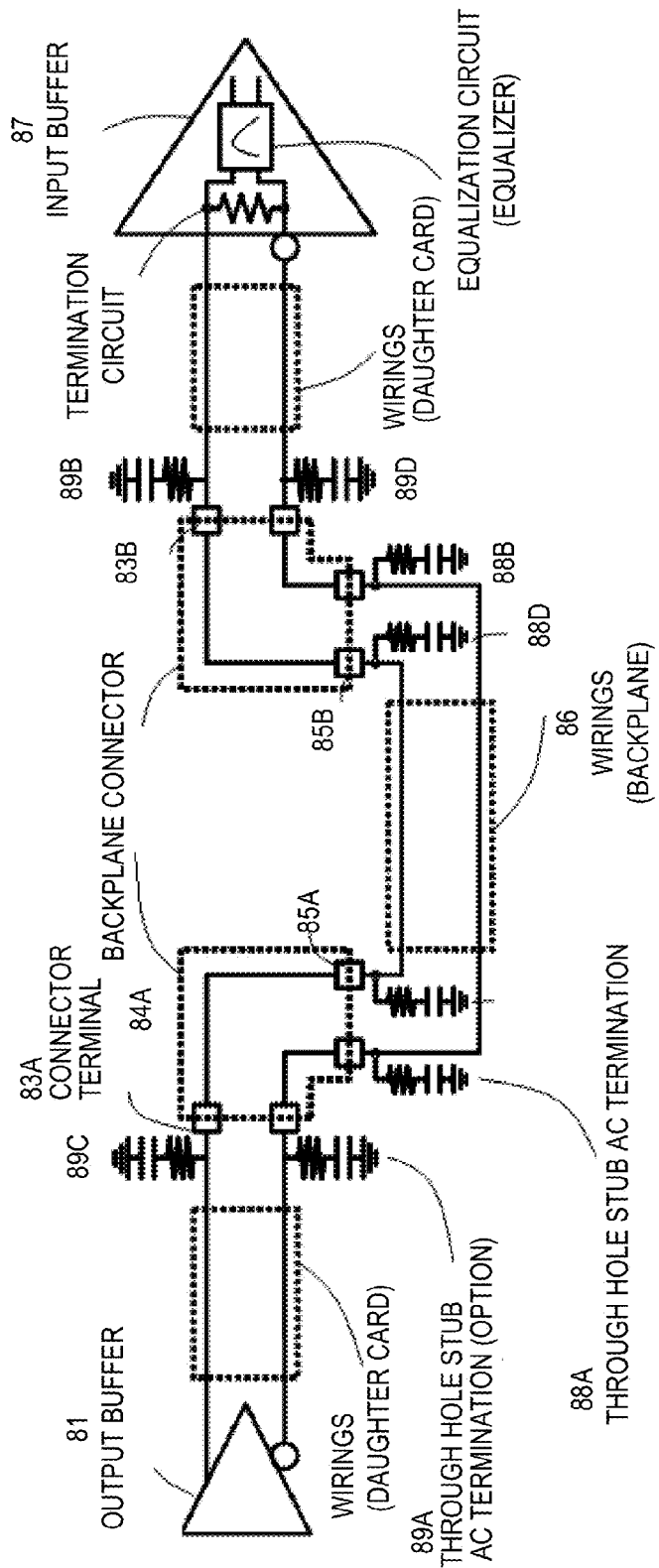
FIG. 17 is a circuit diagram illustrating the configuration of an second exemplary embodiment of the present invention.

FIG. 17 illustrates an example of through-hole stub AC termination according to another exemplary embodiment. In FIG. 8, AC termination is provided across differential signal wirings. However, with an arrangement in which each signal of the differential signal is AC terminated with respect to GND (ground), similar advantageous effects may be obtained.

In the example of FIG. 8, AC termination is formed across differential signals by the through-hole stub AC termination connectors. In an example shown in FIG. 17, respective signals are AC terminated with respect to GND.

A first through-hole stub AC termination connector includes a third connector terminal (106 of FIG. 9) inserted into the first through-hole (92 of FIG. 9) of the backplane opposing to the first connector terminal 85A of the backplane connector 84A; and a first AC termination circuit 88A composed by a series circuit including a first resistor and a first capacitor and being connected between the third connector terminal and the ground.

A second through-hole stub AC termination connector includes a fourth connector terminal inserted into the second through-hole (92 of FIG. 9) of the backplane opposing to the second connector terminal 85A of the backplane connector 84A; and
a second AC termination circuit 88C composed by a series circuit including a second resistor and a second capacitor and being connected between the fourth connector terminal and the ground.

A third through-hole stub AC termination connector includes a fifth connector terminal inserted into the third through-hole (92 of FIG. 9) of the backplane opposing to the first connector terminal 85B of the backplane connector 84B; and
a third AC termination circuit 88B composed by a series circuit including a third resistor and a third capacitor connected between the fifth connector terminal and the ground.

A fourth through-hole stub AC termination connector includes a sixth connector terminal inserted into the fourth through-hole (92 of FIG. 9) of the backplane opposing to the second connector terminals 85B of the backplane connector 84B; and
a fourth AC termination circuit 88D composed by a series circuit including a fourth resistor and a fourth capacitor and being connected between the sixth connector terminal and the ground.

A daughter card may also be including through-hole stub AC termination connectors including AC termination circuits 89A to 89D between GND and connector terminals (interconnect pads) press-fit into open ends of stubs of through-holes that differentially transmit a signal. Such configuration may also lead to advantageous results comparable to those of the above described first exemplary embodiment.

Figure 21:
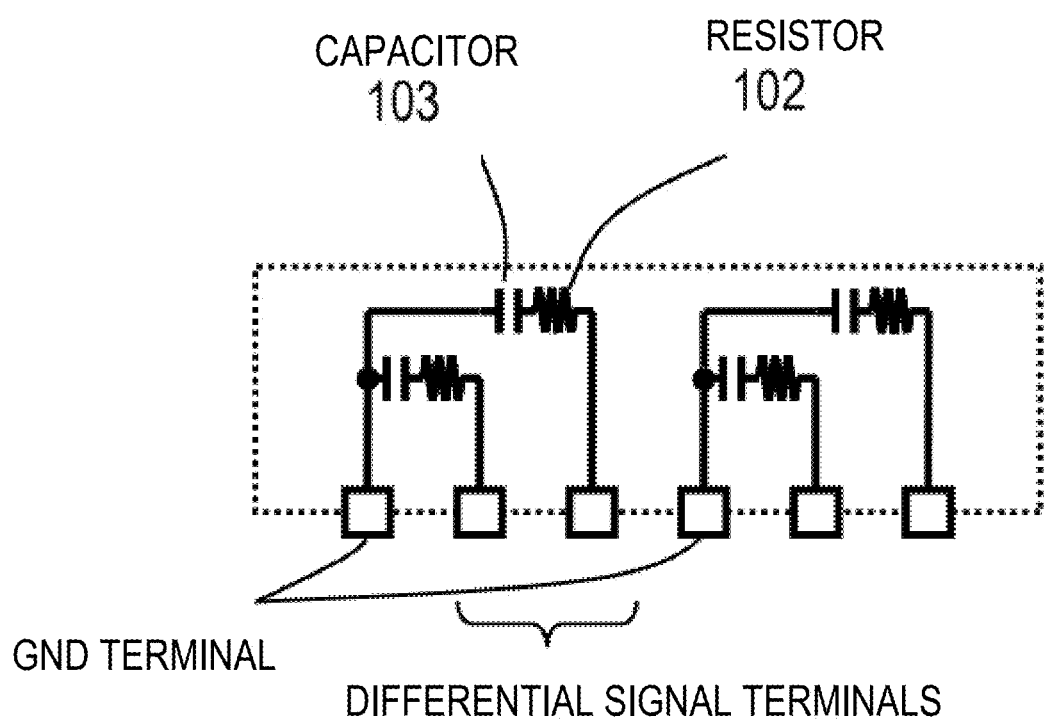
FIG. 21 is a schematic circuit diagram showing a circuit configuration of a through-hole stub AC termination connector of an second exemplary embodiment of the present invention.

In the present exemplary embodiment, a through-hole stub AC termination connector, having a circuit as shown in FIG. 21, may also be used. That is, a series circuit including a resistor and a capacitor is connected between the GND terminal and one of differential signal terminals of the pair differential signal terminals, while another series circuit, including a resistor and a capacitor, is connected between the GND terminal and the other differential signal terminal of the pair differential signal terminals. In FIG. 21, two sets each composed by a differential signal terminal pair and a GND terminal are shown, in which, in each set, each one of the differential signal terminals of the differential signal terminal pair is connected to the GND terminal via a resistor-capacitor series circuit. That is, the through-hole stub AC termination connector may include a plurality of sets each made up of the differential signal terminals and the GND terminal.

In each of the above described exemplary embodiments, a backplane system is taken up as an example of a differential transmission system. However, the present invention may equally be applied to a differential transmission system including a midplane.

The above described exemplary embodiments may be applied to designing of communication equipment, such as routers, switches or switching units, or information processing equipment, such as servers or storages, or electronic circuit boards.

The disclosure of the aforementioned Patent Publications is incorporated by reference herein. The particular exemplary embodiments or examples may be modified or adjusted within the scope of the entire disclosure of the present invention, inclusive of claims, based on the fundamental technical concept of the invention. In addition, a variety of combinations or selections of elements disclosed herein may be used within the concept of the claims. Viz., the present invention may encompass a wide variety of modifications or corrections that may occur to those skilled in the art in accordance with the entire disclosure of the present invention, inclusive of claims and the technical concept of the present invention.

Part or all of the above described exemplary embodiments may be summarized as indicated in following supplementary notes, though not limited thereto.
(Supplementary Note 1)
A transmission system comprising
an AC termination connector including an AC termination circuit composed by a resistor and a capacitor;
the AC termination connector being connected to an open end of a stub of a through-hole provided in a circuit board.
(Supplementary Note 2)
The transmission system according to supplementary note 1, wherein the through-hole includes first and second through-holes that differentially transmit a signal;
first and second connector terminals being inserted from one surface side of the circuit board into the first and second through-holes, respectively;
the AC termination connector including
third and fourth connector terminals inserted, opposing respectively to the first and second connector terminals, into the first and second through-holes in a surface opposite to the one surface of the circuit board; and
the AC termination circuit including a series circuit including a resistor and a capacitor and being connected between the third and fourth connector terminals.
(Supplementary Note 3)
The transmission system according to supplementary note 1, wherein the through-hole includes first and second through-holes that differentially transmit a signal;
first and second connector terminals being inserted from one surface side of the circuit board into the first and second through-holes, respectively;
the AC termination connector including
third and fourth connector terminals inserted, opposing respectively to the first and second connector terminals, into the first and second through-holes in a surface opposite to the one surface side of the circuit board, respectively;
a first AC termination circuit that is including a series circuit including a first resistor and a first capacitor and that is connected between the third connector terminal and the ground; and
a second AC termination circuit that is including a series circuit including a second resistor and a second capacitor and that is connected between the fourth connector terminal and the ground.
(Supplementary Note 4)
The transmission system according to supplementary note 1, wherein the circuit board is either a backplane or a midplane.

(Supplementary Note 5)
The transmission system according to supplementary note 2 or 3, wherein the circuit board is a backplane;

the first and second connector terminals being connector terminals of a backplane connector connected to the first and second through-holes formed in the backplane.

(Supplementary Note 6)
The transmission system according to supplementary note 5, wherein an AC termination connector including an AC termination circuit composed by a resistor and a capacitor is connected to an open end of a stub of a through-hole provided in a daughter card that is mounted to the backplane using a backplane connector.

(Supplementary Note 7)
The transmission system according to supplementary note 6, wherein the daughter card includes first and second through-holes configured to differentially transmit a signal;

first and second connector terminals of the backplane connector being inserted from one surface side of the daughter card into the first and second through-holes;

the AC termination connector including third and fourth connector terminals inserted, opposing respectively to the first and second connector terminals, into the first and second through-holes in a surface opposite to the one surface of the daughter card, respectively; and the AC termination circuit that is connected to the third and fourth connector terminals and that is including a series circuit including the resistor and the capacitor.

(Supplementary Note 8)
The transmission system according to supplementary note 6, wherein the daughter card includes first and second through-holes configured to differentially transmit a signal; the first and second connector terminals of the backplane connector being inserted from one surface side of the daughter card into the first and second through-holes, respectively;

the AC termination connector including third and fourth connector terminals inserted, opposing respectively to the first and second connector terminals, into the first and second through-holes in a surface opposite to the one surface of the circuit board;

a first AC termination circuit including a series circuit including a first resistor and a first capacitor and being connected between the third connector terminal and the ground; and a second AC termination circuit including a series circuit including a second resistor and a second capacitor and being connected between the fourth connector terminal and the ground.

(Supplementary Note 9)
The transmission system according to supplementary note 1, comprising:

a first semiconductor chip including an output buffer differentially outputting a signal;

a first daughter card having mounted thereon the first semiconductor chip and connected thereto;

a first backplane connector configured to install the first daughter card on the backplane;

a second semiconductor chip including an input buffer differentially receiving a signal;

a second daughter card having mounted thereon the second semiconductor chip and connected thereto;

a second backplane connector configured to install the second daughter card on the backplane; and the backplane including the circuit board;

the AC termination connector including a first AC termination connector including a first AC termination circuit and a second AC termination connector including a second AC termination circuit; each of the first and second AC termination circuits being a series circuit composed by a resistor and a capacitor;

first and second connector terminals of the first backplane connector being inserted from one surface side of the backplane into first and second through-holes differentially transmitting a signal;

the first and second connector terminals of the second backplane connector being inserted from one surface side of the backplane into third and fourth through-holes differentially transmitting a signal;

the first AC termination connector including third and fourth connector terminals inserted, opposing respectively to the first and second connector terminals of the first backplane connector, into the first and second through-holes in a surface opposite to the one surface of the backplane, respectively; and the first AC termination circuit that is connected between the third and fourth connector terminals and that is including a series circuit including a first resistor and a capacitor;

the second AC termination connector including fifth and sixth connector terminals inserted, opposing respectively to the first and second connector terminals of the second backplane connector, into the third and fourth through-holes in a surface opposite to the one surface of the backplane; and the second AC termination circuit that is connected between the fifth and sixth connector terminals and that is including a series circuit including a second resistor and a third capacitor.

(Supplementary Note 10)
The transmission system according to supplementary note 1 comprising:

a first semiconductor chip including an output buffer differentially outputting a signal;

a first daughter card having mounted thereon the first semiconductor chip and connected thereto;

a first backplane connector configured to install the first daughter card on the backplane;

a second semiconductor chip including an input buffer differentially receiving a signal;

a second daughter card having mounted thereon the second semiconductor chip and connected thereto;

a second backplane connector configured to install the second daughter card on the backplane; and the backplane including the circuit board;

the AC termination connector including first to fourth AC termination connectors including first to fourth AC termination circuits, respectively; each of the first to fourth AC termination circuits including a series circuit composed by a resistor and a capacitor;

first and second connector terminals of the first backplane connector being inserted from one surface side of the backplane into first and second through-holes configured to differentially transmit a signal;

first and second connector terminals of the second backplane connector being inserted from one surface side of the backplane into third and fourth through-holes differentially transmitting a signal;

the first AC termination connector including a third connector terminal inserted, opposing to the first connector terminal of the first backplane connector, into the first through-hole in a surface opposite to the one surface of the backplane; and a first AC termination circuit including a series circuit including a first resistor and a first capacitor and being connected between the third connector terminal and the ground;

the second AC termination connector including a fourth connector terminal inserted, opposing to the second connector terminal of the first backplane connector, into the second through-hole in a surface opposite to the one surface of the backplane; and a second AC termination circuit including a series circuit including a second resistor and a second capacitor and being connected between the fourth connector terminal and the ground;

the third AC termination connector including a fifth connector terminal inserted, opposing to the first connector terminal of the second backplane connector, into the third through-hole in a surface opposite to the one surface of the backplane; and a third AC termination circuit including a series circuit including a third resistor and a third capacitor and being connected between the fifth connector terminal and the ground;

the fourth AC termination connector including a sixth connector terminal inserted, opposing to the second connector terminal of the second backplane connector, into the fourth through-hole in a surface opposite to the one surface of the backplane; and a fourth AC termination circuit including a series circuit including a fourth resistor and a fourth capacitor and being connected between the sixth connector terminal and the ground.

(Supplementary Note 11)

A method for constructing a backplane system comprising connecting an AC termination connector to an open end of a stub of a through-hole provided in a backplane; the AC termination connector including an AC termination circuit including a resistor and a capacitor.

(Supplementary Note 12)

The method for constructing a backplane system according to supplementary note 11, wherein the through-hole includes first and second through-holes configured to differentially transmit a signal;

the first and second connector terminals being inserted from one surface side of the backplane into the first and second through-holes, respectively;

the AC termination connector including third and fourth connector terminals inserted, opposing respectively to the first and second connector terminals, into the first and second through-holes in a surface opposite to the one surface of the backplane; and the AC termination circuit including a series circuit including the resistance and the capacitor and being connected between the third and fourth connector terminals.

(Supplementary Note 13)

The method for constructing a backplane system according to supplementary note 11, wherein, the through-hole includes first and second through-holes differentially transmitting a signal; the method comprising inserting the first and second connector terminals from one surface side of the backplane into the first and second through-holes, respectively;

the AC termination connector including third and fourth connector terminals inserted, opposing respectively to the first and second connector terminals, into the first and second through-holes in a surface opposite to the one surface of the backplane; and the method further comprising configuring a first AC termination circuit that is including a series circuit including a first resistor and a first capacitor and that is connected between the third connector terminal and the ground; and configuring a second AC termination circuit that is including a series circuit including a second resistor and a second capacitor and that is connected between the fourth connector terminal and the ground.

The invention claimed us:

1. A transmission system comprising:

an equalizer with a frequency characteristic inversed to a transmission characteristic of a transmission line on which a signal is transmitted and from which the equalizer receives the signal, the equalizer performing waveform shaping of the received signal to allow for discrimination of a logical level of the signal by enlarging or reducing an amplitude of the signal in correspondence with a pulse width of the signal;

a circuit board constituting the transmission line; and an AC termination connector connected to an open end of a stub of a through-hole provided in the circuit board, the AC termination connector including an AC termination circuit including a resistor and a capacitor, the AC termination circuit being configured to suppress a resonant oscillation of the stub in the through-hole to prevent a non-uniform waveform propagation to the equalizer due to the resonant oscillation of the stub.

2. A transmission system, comprising:

a circuit board; and an AC termination connector connected to an open end of a stub of a through-hole provided in the circuit board, the AC termination connector including an AC termination circuit including a resistor and a capacitor, wherein the through-hole includes:

first and second through-holes configured to differentially transmit a signal, first and second connector terminals being inserted from one surface side of the circuit board into the first and second through-holes, respectively, and wherein the AC termination connector comprises a first AC termination connector including:

third and fourth connector terminals inserted, opposing respectively to the first and second connector terminals, into the first and second through-holes in a surface opposite to the one surface side of the circuit board; and a first AC termination circuit including a series circuit including the resistor and the capacitor and being connected between the third and fourth connector terminals.

3. The transmission system according to claim 2, wherein the circuit board is a backplane, and the first and second connector terminals are connector terminals of a backplane connector connected to the first and second through-holes provided in the backplane.

4. The transmission system according to claim 3, wherein the AC termination connector includes a second AC termination connector including a third AC termination circuit including a series circuit including a resistor and a capacitor and being connected to an open end of a stub of a through-hole provided in a daughter card installed on the backplane with the backplane connector.

5. The transmission system according to claim 4, wherein the daughter card includes first and second through-holes to differentially transmit signal, the first and second connector terminals of the backplane connector being inserted from one surface side of the daughter card into the first and second through-holes, respectively, and wherein the second AC termination connector includes:
third and fourth connector terminals inserted, opposing respectively to the first and second connector terminals, into the first and second through-holes in a surface opposite to the one surface side of the daughter card, and
a third AC termination circuit including
a series circuit including the resistor and the capacitor and being connected between the third and fourth connector terminals.

6. The transmission system according to claim 4, wherein the daughter card includes
first and second through-holes configured to differentially transmit a signal, the first and second connector terminals of the backplane connector being inserted from the one surface side of the daughter card into the first and second through-holes, respectively, and
wherein the second AC termination connector includes:
third and fourth connector terminals inserted, opposing respectively to the first and second connector terminals, into the first and second through-holes in a surface opposite to the one surface side of the circuit board;
the third AC termination circuit including
a series circuit including a first resistor and a first capacitor and being connected between the third connector terminal and the ground; and
a fourth AC termination circuit including
a series circuit including a second resistor and a second capacitor and being connected between the fourth connector terminal and the ground.

7. A transmission system, comprising:
a circuit board; and
an AC termination connector connected to an open end of a stub of a through-hole provided in the circuit board, the AC termination connector including
an AC termination circuit including a resistor and a capacitor,
wherein the through-hole includes
first and second through-holes to differentially transmit a signal, and
first and second connector terminals being inserted from one surface side of the circuit board into the first and second through-holes, respectively, and
wherein the AC termination connector comprises
a first AC termination connector including
third and fourth connector terminals inserted, opposing respectively with the first and second connector terminals, into the first and second through-holes in a surface opposite to the one surface side of the circuit board;
a first AC termination circuit including
a series circuit including a first resistor and a first capacitor and being connected between the third connector terminal and the ground; and
a second AC termination circuit including
a series circuit including a second resistor and a second capacitor and being connected between the fourth connector terminal and the ground.

8. The transmission system according to claim 7, wherein the circuit board is a backplane, and the first and second connector terminals are connector terminals of a backplane connector connected to the first and second through-holes provided in the backplane.

9. A transmission system, comprising:
a circuit board;
an AC termination connector connected to an open end of a stub of a through-hole provided in the circuit board, the AC termination connector including
an AC termination circuit including a resistor and a capacitor;
a first semiconductor chip including an output buffer configured to differentially output a signal;
a first daughter card including thereon the first semiconductor chip and connected thereto;
a first backplane connector configured to install the first daughter card on the backplane;
a second semiconductor chip including an input buffer configured to differentially receive a signal;
a second daughter card including thereon the second semiconductor chip and connected thereto;
a second backplane connector configured to install the second daughter card on the backplane; and
a backplane including the circuit board,
wherein the AC termination connector includes
first and second AC termination connectors respectively including first and second AC termination circuits, each including a series circuit including a resistor and a capacitor,
first and second connector terminals of the first backplane connector being inserted from one surface side of the backplane into first and second through-holes differentially transmitting a signal,
first and second connector terminals of the second backplane connector being inserted from one surface side of the backplane into third and fourth through-holes differentially transmitting a signal,
wherein the first AC termination connector includes
third and fourth connector terminals inserted, opposing respectively to the first and second connector terminals of the first backplane connector, into the first and second through-holes in a surface opposite to the one surface of the backplane, respectively; and
a first AC termination circuit including
a series circuit including a first resistor and a first capacitor and being connected between the third and fourth connector terminals, and
wherein the second AC termination connector includes
fifth and sixth connector terminals inserted, opposing respectively to the first and second connector terminals of the second backplane connector, into the third and fourth through-holes in a surface opposite to the one surface of the backplane, respectively; and
a second AC termination circuit including
a series circuit including a second resistor and a third capacitor and being connected between the fifth and sixth connector terminals.

10. A transmission system, comprising:
a circuit board;
an AC termination connector connected to an open end of a stub of a through-hole provided in the circuit board, the AC termination connector including
an AC termination circuit including a resistor and a capacitor;
a first semiconductor chip including an output buffer configured to differentially output a signal;
a first daughter card including thereon the first semiconductor chip and connected thereto;

a first backplane connector configured to install the first daughter card on the backplane;
a second semiconductor chip including an input buffer configured to differentially receive a signal;
a second daughter card including thereon the second semiconductor chip and connected thereto;
a second backplane connector configured to install the second daughter card on the backplane; and
a backplane including the circuit board,
wherein the AC termination connector includes
first to fourth AC termination connectors respectively including first to fourth AC termination circuits, each including a series circuit including a resistor and a capacitor;
first and second connector terminals of the first backplane connector being inserted from one surface side of the backplane into first and second through-holes differentially transmitting a signal;
first and second connector terminals of the second backplane connector being inserted from one surface side of the backplane into third and fourth through-holes differentially transmitting a signal,
wherein the first AC termination connector includes:
a third connector terminal inserted, opposing to the first connector terminal of the first backplane connector, into the first through-hole in a surface opposite to the one surface of the backplane; and
a first AC termination circuit including
a series circuit including a first resistor and a first capacitor and being connected between the third connector terminal and the ground,
wherein the second AC termination connector includes:
a fourth connector terminal inserted, opposing to the second connector terminal of the first backplane connector, into the second through-hole in a surface opposite to the one surface of the backplane; and
a second AC termination circuit including
a series circuit including a second resistor and a second capacitor and being connected between the fourth connector terminal and the ground,
wherein the third AC termination connector includes:
a fifth connector terminal inserted, opposing to the first connector terminal of the second backplane connector, into the third through-hole in a surface opposite to the one surface of the backplane; and
a third AC termination circuit including
a series circuit including a third resistor and a third capacitor and being connected between the fifth connector terminal and the ground, and
wherein the fourth AC termination connector includes:
a sixth connector terminal inserted, opposing to the second connector terminal of the second backplane connector, into the fourth through-hole in a surface opposite to the one surface of the backplane; and
a fourth AC termination circuit including
a series circuit including a fourth resistor and fourth capacitor and being connected between the sixth connector terminal and the ground.

11. A method for constructing a backplane system, the method comprising:
connecting an AC termination connector, including an AC termination circuit including a resistor and a capacitor, to an open end of a stub of a through-hole provided in a backplane, the through-hole constituting a part of a transmission line of a signal to an equalizer, the equalizer with a frequency characteristic inversed to a transmission characteristic of the transmission line from which the equalizer receives the signal performing waveform shaping of the received signal to allow for discrimination of a logical level of the signal by enlarging or reducing an amplitude of the signal in correspondence with a pulse width of the signal; and
suppressing, by the AC termination connector, a resonant oscillation of the stub in the through-hole to prevent a non-uniform waveform propagation to the equalizer due to the resonant oscillation of the stub.

12. A connector, comprising:
an AC termination circuit including a resistor and a capacitor, the connector connected to an open end of a stub of a through-hole provided in a circuit board, the through-hole constituting a part of a transmission line of a signal to an equalizer, the AC termination circuit being configured to suppress a resonant oscillation of the stub in the through-hole to prevent a non-uniform waveform propagation to the equalizer due to the resonant oscillation of the stub.

13. A connector, comprising:
an AC termination circuit including a resistor and a capacitor, the connector connected to an open end of a stub of a through-hole provided in a circuit board,
wherein the connector includes:
first and second connector terminals inserted, opposing respectively to third and fourth connector terminals, into first and second through-holes in a surface opposite to one surface side of the circuit board, the first and second through-holes configured to differentially transmit a signal, the third and fourth connector terminals being inserted from the one surface side of the circuit board into the first and second through-holes, respectively; and
a first AC termination circuit including
a series circuit including the resistor and the capacitor and being connected between the first and second connector terminals.

14. A connector, comprising:
an AC termination circuit including a resistor and a capacitor, the connector connected to an open end of a stub of a through-hole provided in a circuit board,
wherein the connector includes:
first and second connector terminals inserted, opposing respectively to third and fourth connector terminals, into first and second through-holes in a surface opposite to one surface side of the circuit board, the first and second through-holes configured to differentially transmit a signal, the third and fourth connector terminals being inserted from the one surface side of the circuit board into the first and second through-holes, respectively;
a first AC termination circuit including
a series circuit including a first resistor and a first capacitor and being connected between the first connector terminal and the ground; and
a second AC termination circuit including
a series circuit including a second resistor and a second capacitor and being connected between the second connector terminal and the ground.

* * * * *